(12) United States Patent
Hill

(10) Patent No.: US 7,528,961 B2
(45) Date of Patent: May 5, 2009

(54) COMPENSATION OF TURBULENT EFFECTS OF GAS IN MEASUREMENT PATHS OF MULTI-AXIS INTERFEROMETERS

(75) Inventor: Henry A. Hill, Tucson, AZ (US)

(73) Assignee: Zygo Corporation, Middlefield, CT (US)

( * ) Notice: Subject to any disclaimer, the term of this patent is extended or adjusted under 35 U.S.C. 154(b) by 247 days.

(21) Appl. No.: 11/413,917

(22) Filed: Apr. 28, 2006

(65) Prior Publication Data
US 2006/0256346 A1 Nov. 16, 2006

Related U.S. Application Data

(60) Provisional application No. 60/676,190, filed on Apr. 29, 2005.

(51) Int. Cl.
G01B 9/02 (2006.01)
G01B 11/02 (2006.01)

(52) U.S. Cl. .................. 356/509; 356/487; 356/493

(58) Field of Classification Search .............. 356/517, 356/485, 492, 495, 509, 510, 487, 493
See application file for complete search history.

(56) References Cited

U.S. PATENT DOCUMENTS

| 4,685,803 A | 8/1987 | Sommargren |
|---|---|---|
| 4,688,940 A | 8/1987 | Sommargren et al. |
| 4,733,967 A | 3/1988 | Sommargren |
| 4,948,254 A | 8/1990 | Ishida |
| 5,064,286 A * | 11/1991 | Ai et al. ................ 356/153 |
| 5,404,222 A | 4/1995 | Lis |
| 5,537,209 A | 7/1996 | Lis |
| 5,764,362 A | 6/1998 | Hill et al. |
| 5,801,832 A | 9/1998 | Van Den Brink |
| 5,838,485 A | 11/1998 | de Groot et al. |
| 6,137,574 A | 10/2000 | Hill |
| 6,219,144 B1 * | 4/2001 | Hill et al. ............... 356/487 |
| 6,246,481 B1 | 6/2001 | Hill |
| 6,252,668 B1 | 6/2001 | Hill |
| 6,525,826 B2 * | 2/2003 | De Groot et al. ......... 356/517 |
| 6,687,008 B1 * | 2/2004 | Peale et al. ............. 356/477 |
| 6,757,066 B2 | 6/2004 | Hill |
| 6,778,280 B2 * | 8/2004 | De Groot et al. ......... 356/493 |
| 6,806,961 B2 | 10/2004 | Hill |
| 6,806,962 B2 | 10/2004 | Hill |

(Continued)

OTHER PUBLICATIONS

Bobroff, Norman. "Recent advances in displacement measuring interferometry." Meas. Sci. Technol. 4, pp. 907-926, 1993.

(Continued)

Primary Examiner—Patrick J Connolly
Assistant Examiner—Scott M Richey
(74) Attorney, Agent, or Firm—Fish & Richardson P.C.

(57) ABSTRACT

In general, in a first aspect, the invention features a method that includes using an interferometry assembly to provide three different output beams, each output beam including an interferometric phase related to an optical path difference between a corresponding first beam and a corresponding second beam, each first beam contacting a measurement object at least once, monitoring the interferometric phases for each of the three different output beams, and deriving information about variations in the optical properties of a gas in the first beam paths from the three monitored phases.

38 Claims, 9 Drawing Sheets

U.S. PATENT DOCUMENTS

| | | | |
|---|---|---|---|
| 6,819,434 B2 * | 11/2004 | Hill | 356/509 |
| 6,842,256 B2 * | 1/2005 | Hill | 356/517 |
| 6,891,624 B2 | 5/2005 | Hill | |
| 6,950,192 B2 | 9/2005 | Hill | |
| 2003/0151750 A1 | 8/2003 | Hill | |
| 2003/0186134 A1 | 10/2003 | Hill | |
| 2004/0141185 A1 | 7/2004 | Hill | |
| 2005/0146727 A1 | 7/2005 | Hill | |
| 2005/0162664 A1 | 7/2005 | Hill | |
| 2005/0237536 A1 | 10/2005 | Hill et al. | |
| 2005/0248772 A1 | 11/2005 | Hill et al. | |

OTHER PUBLICATIONS

Bobroff, Norman. "Residual errors in laser interferometry from air turbulence and nonlinearity." Applied Optics, 26:13, pp. 2676-2682, 1987.

Estler, W.T. "High-Accuracy Displacement Interferometry in Air," Appl. Opt. 24:6, pp. 808-815, 1985.

Ishida, A. "Two Wavelength Displacement-Measuring Interferometer using Second-Harmonic Light to Eliminate Air-Turbulence-Induced Errors," Jpn. J. Appl. Phys. 28:3, pp. L473-L475, 1989.

J.-P. Monchalin et al., "Accurate Laser Wavelength Measurement With A Precision Two-Beam Scanning Michelson Interferometer" *Applied Optics*, 20(5), 736-757, (1981).

Jones, F.E. "The Refractivity of Air," J. Res. NBS 86:1, pp. 27-32, 1981.

Lis, S.A. "An Air Turbulence Compensated Interferometer for IC Manufacturing," SPIE 2440, 1995.

Zanoni, C. "Differential interferometer arrangements for distance and angle measurements: Principles, advantages and applications" *VDI Berichte* Nr. 749, 93-106 (1989).

Zhu et al., "Long-Arm Two-Color Interferometer for Measuring the Change of Air Refractive Index," SPIE 1319, pp. 538-539, 1990.

* cited by examiner

COMPENSATION OF TURBULENT EFFECTS OF GAS IN MEASUREMENT PATHS OF MULTI-AXIS INTERFEROMETERS

CROSS-REFERENCE TO RELATED APPLICATIONS

This application claims priority to Provisional Patent Application 60/676,190, entitled "COMPENSATION OF TURBULENT EFFECTS OF GAS IN MEASUREMENT PATHS OF MULTI-AXIS INTERFEROMETERS," filed on Apr. 29, 2005, the entire contents of which are hereby incorporated by reference.

BACKGROUND

This invention relates to interferometry systems and methods of using interferometry systems.

Displacement measuring interferometers monitor changes in the position of a measurement object relative to a reference object based on an optical interference signal. The interferometer generates the optical interference signal by overlapping and interfering a measurement beam reflected from the measurement object with a reference beam reflected from the reference object.

In many applications, the measurement and reference beams have orthogonal polarizations and different frequencies. The different frequencies can be produced, for example, by laser Zeeman splitting, by acousto-optical modulation, or internal to the laser using birefringent elements or the like. The orthogonal polarizations allow a polarizing beam-splitter to direct the measurement and reference beams to the measurement and reference objects, respectively, and combine the reflected measurement and reference beams to form overlapping exit measurement and reference beams. The overlapping exit beams form an output beam that subsequently passes through a polarizer.

The polarizer mixes polarizations of the exit measurement and reference beams to form a mixed beam. Components of the exit measurement and reference beams in the mixed beam interfere with one another so that the intensity of the mixed beam varies with the relative phase of the exit measurement and reference beams.

A detector measures the time-dependent intensity of the mixed beam and generates an electrical interference signal proportional to that intensity. Because the measurement and reference beams have different frequencies, the electrical interference signal includes a "heterodyne" signal having a beat frequency equal to the difference between the frequencies of the exit measurement and reference beams. If the lengths of the measurement and reference paths are changing relative to one another, e.g., by translating a stage that includes the measurement object, the measured beat frequency includes a Doppler shift equal to $2\nu np/\lambda$, where $\nu$ is the relative speed of the measurement and reference objects, $\lambda$ is the wavelength of the measurement and reference beams, n is the refractive index of the medium through which the light beams travel, e.g., air or vacuum, and p is the number of passes to the reference and measurement objects. Changes in the phase of the measured interference signal correspond to changes in the relative position of the measurement object, e.g., a change in phase of $2\pi$ corresponds substantially to a distance change d of $\lambda/(2np)$. Distance 2d is a round-trip distance change or the change in distance to and from a stage that includes the measurement object. In other words, the phase $\Phi$, ideally, is directly proportional to d, and can be expressed as $$\Phi = 2pkd, \qquad (1)$$

$$\text{where } k = \frac{2\pi n}{\lambda}.$$

Unfortunately, the observable interference phase, $\tilde{\Phi}$, is not always identically equal to phase $\Phi$. Many interferometers include, for example, non-linearities such as "cyclic errors." Cyclic errors can be expressed as contributions to the observable phase and/or the intensity of the measured interference signal and have a sinusoidal dependence on the change in for example optical path length 2pnd. In particular, a first order cyclic error in phase has for the example a sinusoidal dependence on $(4\pi pnd)/\lambda$, and a second order cyclic error in phase has for the example a sinusoidal dependence on $2(4\pi pnd)/\lambda$. Higher order cyclic errors can also be present as well as sub-harmonic cyclic errors and cyclic errors that have a sinusoidal dependence of other phase parameters of an interferometer system comprising detectors and signal processing electronics. Different techniques for quantifying such cyclic errors are described in commonly owned U.S. Pat. No. 6,137,574, U.S. Pat. No. 6,252,688, and U.S. Pat. No. 6,246,481 by Henry A. Hill.

In addition to cyclic errors, there are other sources of deviations in the observable interference phase from $\Phi$, such as, for example, non-cyclic non-linearities or non-cyclic errors. One example of a source of a non-cyclic error is the diffraction of optical beams in the measurement paths of an interferometer. Non-cyclic error due to diffraction has been determined for example by analysis of the behavior of a system such as found in the work of J.-P. Monchalin, M. J. Kelly, J. E. Thomas, N. A. Kurnit, A. Szöke, F. Zemike, P. H. Lee, and A. Javan, "Accurate Laser Wavelength Measurement With A Precision Two-Beam Scanning Michelson Interferometer," *Applied Optics*, 20(5), 736-757, 1981.

A second source of non-cyclic errors is the effect of "beam shearing" of optical beams across interferometer elements and the lateral shearing of reference and measurement beams one with respect to the other. Beam shears can be caused, for example, by a change in direction of propagation of the input beam to an interferometer or a change in orientation of the object mirror in a double pass plane mirror interferometer such as a differential plane mirror interferometer (DPMI) or a high stability plane mirror interferometer (HSPMI).

Inhomogeneities in the interferometer optics may cause wavefront errors in the reference and measurement beams. When the reference and measurement beams propagate collinearly with one another through such inhomogeneities, the resulting wavefront errors are identical and their contributions to the interferometric signal cancel each other out. More typically, however, the reference and measurement beam components of the output beam are laterally displaced from one another, i.e., they have a relative beam shear. Such beam shear causes the wavefront errors to contribute an error to the interferometric signal derived from the output beam.

Moreover, in many interferometry systems beam shear changes as the position or angular orientation of the measurement object changes. For example, a change in relative beam shear can be introduced by a change in the angular orientation of a plane mirror measurement object. Accordingly, a change in the angular orientation of the measurement object produces a corresponding error in the interferometric signal.

The effect of the beam shear and wavefront errors will depend upon procedures used to mix components of the output beam with respect to component polarization states and to detect the mixed output beam to generate an electrical interference signal. The mixed output beam may for example be detected by a detector without any focusing of the mixed beam onto the detector, by detecting the mixed output beam as a beam focused onto a detector, or by launching the mixed output beam into a single mode or multi-mode optical fiber and detecting a portion of the mixed output beam that is transmitted by the optical fiber. The effect of the beam shear and wavefront errors will also depend on properties of a beam stop should a beam stop be used in the procedure to detect the mixed output beam. Generally, the errors in the interferometric signal are compounded when an optical fiber is used to transmit the mixed output beam to the detector.

Amplitude variability of the measured interference signal can be the net result of a number of mechanisms. One mechanism is a relative beam shear of the reference and measurement components of the output beam that is for example a consequence of a change in orientation of the measurement object.

In dispersion measuring applications, optical path length measurements are made at multiple wavelengths, e.g., 532 nm and 1064 nm, and are used to measure dispersion of a gas in the measurement path of the distance measuring interferometer. The dispersion measurement can be used in converting the optical path length measured by a distance measuring interferometer into a physical length. Such a conversion can be important since changes in the measured optical path length can be caused by gas turbulence and/or by a change in the average density of the gas in the measurement arm even though the physical distance to the measurement object is unchanged.

The interferometers described above are often components of metrology systems in scanners and steppers used in lithography to produce integrated circuits on semiconductor wafers. Such lithography systems typically include a translatable stage to support and fix the wafer, focusing optics used to direct a radiation beam onto the wafer, a scanner or stepper system for translating the stage relative to the exposure beam, and one or more interferometers. Each interferometer directs a measurement beam to, and receives a reflected measurement beam from, e.g., a plane mirror attached to the stage. Each interferometer interferes its reflected measurement beams with a corresponding reference beam, and collectively the interferometers accurately measure changes in the position of the stage relative to the radiation beam. The interferometers enable the lithography system to precisely control which regions of the wafer are exposed to the radiation beam.

In many lithography systems and other applications, the measurement object includes one or more plane mirrors to reflect the measurement beam from each interferometer. Small changes in the angular orientation of the measurement object, e.g., corresponding to changes in the pitch and/or yaw of a stage, can alter the direction of each measurement beam reflected from the plane mirrors. If left uncompensated, the altered measurement beams reduce the overlap of the exit measurement and reference beams in each corresponding interferometer. Furthermore, these exit measurement and reference beams will not be propagating parallel to one another nor will their wave fronts be aligned when forming the mixed beam. As a result, the interference between the exit measurement and reference beams will vary across the transverse profile of the mixed beam, thereby corrupting the interference information encoded in the optical intensity measured by the detector.

To address this problem, many conventional interferometers include a retroreflector that redirects the measurement beam back to the plane mirror so that the measurement beam "double passes" the path between the interferometer and the measurement object. The presence of the retroreflector insures that the direction of the exit measurement is insensitive to changes in the angular orientation of the measurement object. When implemented in a plane mirror interferometer, the configuration results in what is commonly referred to as a high-stability plane mirror interferometer (HSPMI). However, even with the retroreflector, the lateral position of the exit measurement beam remains sensitive to changes in the angular orientation of the measurement object. Furthermore, the path of the measurement beam through optics within the interferometer also remains sensitive to changes in the angular orientation of the measurement object.

In practice, the interferometry systems are used to measure the position of the wafer stage along multiple measurement axes. For example, defining a Cartesian coordinate system in which the wafer stage lies in the x-y plane, measurements are typically made of the x and y positions of the stage as well as the angular orientation of the stage with respect to the z axis, as the wafer stage is translated along the x-y plane. Furthermore, it may be desirable to also monitor tilts of the wafer stage out of the x-y plane. For example, accurate characterization of such tilts may be necessary to calculate Abbé offset errors in the x and y positions. Thus, depending on the desired application, there may be up to five degrees of freedom to be measured. Moreover, in some applications, it is desirable to also monitor the position of the stage with respect to the z-axis, resulting in a sixth degree of freedom.

To measure each degree of freedom, an interferometer is used to monitor distance changes along a corresponding metrology axis. For example, in systems that measure the x and y positions of the stage as well as the angular orientation of the stage with respect to the x, y, and z axes, at least three spatially separated measurement beams reflect from one side of the wafer stage and at least two spatially separated measurement beams reflect from another side of the wafer stage. See, e.g., U.S. Pat. No. 5,801,832 entitled "METHOD OF AND DEVICE FOR REPETITIVELY IMAGING A MASK PATTERN ON A SUBSTRATE USING FIVE MEASURING AXES," the contents of which are incorporated herein by reference. Each measurement beam is recombined with a reference beam to monitor optical path length changes along the corresponding metrology axes. Because the different measurement beams contact the wafer stage at different locations, the angular orientation of the wafer stage can then be derived from appropriate combinations of the optical path length measurements. Accordingly, for each degree of freedom to be monitored, the system includes at least one measurement beam that contacts the wafer stage. Furthermore, as described above, each measurement beam may double-pass the wafer stage to prevent changes in the angular orientation of the wafer stage from corrupting the interferometric signal. The measurement beams may be generated from physically separate interferometers or from multi-axes interferometers that generate multiple measurement beams.

SUMMARY

An example of where an interferometer is used for high-precision measurements is to monitor the position of components in a lithography system. During the operation of such a system, the gas environment can frequently change. For example, introducing new wafers into the system causes gas movement in the system, as does removing them after exposure. Scanning or stepping the wafer and/or reticle during an exposure cycle can also cause gas movement in the system. In addition, temperature changes during an exposure cycle can affect environmental parameters like humidity and density, which can both affect gas refractivity. Furthermore, at different stages during an exposure cycle, the chamber can be flushed with various process gases, further disrupting the system's environment.

Because of these and other influences, the density, composition, temperature, and/or pressure of gas in the system can vary, giving rise to corresponding variations in the refractivity of the gas in the system. In addition, these variations in gas refractivity can occur at different times and at different locations in a lithography system during an exposure cycle. In such situations, the accuracy of interferometer measurements of the position and location of the wafer stage can be compromised if the refractivity variations associated with these perturbations to the environment are not accounted for.

In this disclosure, interferometric systems and methods are described for determining information about the effects of local gas refractivity perturbations, such as the effects of gas turbulence, on measurements made using an interferometer and compensating for these effects. The measurements include interferometric measurements of a change in linear and/or angular displacement of an object where perturbations in the refractivity of the gas are in the path of a measurement beam of the interferometer.

In embodiments, effects of gas refractivity variations are measured using an interferometry system that includes multiple parallel measurement axes. Simultaneous measurements along each axis are used to determine values of a parameter (e.g., a second difference parameter) that is insensitive to variations in the position of a measurement object along the axes and insensitive (at least to low order) to variations in the orientation of the measurement object with respect to the interferometer axes. Accordingly, ignoring other sources of errors in the measurements (e.g., mirror surface flatness errors, cyclic errors, non-cyclic errors), variations in the measured parameter can be attributed to the variations in gas refractivity in the measurement beam paths. Measurements of the parameter can be used to provide information about the gas refractivity variations. In particular, second and/or higher order spatial derivatives of the effects of variations in gas refractivity are measured with multiple-axes-per-plane interferometers where the predominant flow of the gas is in the plane of the multiple axes of the interferometer. The second and/or higher order spatial derivatives of the effects are integrated with respect to corresponding temporal and spatial coordinates to generate a contemporaneous measurement of gas refractivity variation effects on measurements of linear and angular displacements by the interferometers.

Measurements of the differential effects are made at the same wavelength that is used in the interferometer for measuring the linear or an angular displacement of a plane mirror measurement object.

The interferometers can include double pass plane mirror interferometers where a measurement path of one of the double passes of each of the plane mirror interferometers are common, i.e., coextensive.

Information about gas refractivity variations can be used to correct for other measurements made using an interferometer, such as displacement measurements and/or orientation measurements of a measurement object. The corrections can be made contemporaneously and/or non-contemporaneously to acquiring the information about the gas refractivity variations.

In general, in a first aspect, the invention features a method that includes using an interferometry assembly to provide three different output beams, each output beam including an interferometric phase related to an optical path difference between a corresponding first beam and a corresponding second beam, each first beam contacting a measurement object at least once, monitoring the interferometric phases for each of the three different output beams, and deriving information about variations in the optical properties of a gas in the first beam paths from the three monitored phases.

Embodiments of the method can include one or more of the following features and/or features of other aspects. For example, the interferometer assembly can define three interferometer axes and each interferometric phase includes information about a position of the measurement object along a corresponding one of the interferometer axes. The interferometer axes can be parallel. The interferometer axes can be coplanar.

Each of the first beams can contact the measurement object more than once (e.g., twice, three times, more than three times). Each of the first beams can contact the measurement object at a common location for at least one of the passes to the measurement object. In some embodiments, each of the second beams also contact the measurement object.

The variations in the optical properties of the gas can be caused by local refractivity variations that move through the first beam paths. Variations in the three interferometric phases can be temporally correlated to the local refractivity variations.

The method can include monitoring a degree of freedom of the measurement object from one of the interferometric phases. Deriving the information can include reducing errors in the monitored degree of freedom, where the errors are related to the variations in the optical properties of a gas in the first beam paths. The errors can be reduced while the phases are being monitored. The degree of freedom can be a displacement of the measurement object along an interferometer axis defined by the interferometry assembly. In some embodiments, the degree of freedom is an orientation of the measurement object with respect to an interferometer axis defined by the interferometry assembly.

Deriving the information can include determining values of a parameter from the monitored interferometric phases where, for a given position of the measurement object, the parameter is based on a difference between the position of the measurement object along a first interferometer axis and the position of the measurement object along a second interferometer axis parallel to the first interferometer axis, the first and second interferometer axes being defined by the interferometry assembly. The parameter can also be based on a difference between the position of the measurement object along the second interferometer axis and the position of the measurement object along a third interferometer axis parallel to the second interferometer axis, the third interferometry axis being defined by the interferometry assembly. Deriving the information can include determining values of a second difference parameter, SDP, from the monitored interferometric phases. A time average of the contributions of the variations of the optical properties of the gas to the second difference parameter can be zero. Deriving the information can further include determining a difference, $SDP_T$, between the second difference parameter value at time, t, and an average second difference parameter value. Furthermore, deriving the information can include integrating the difference $SDP_T$ over a time period. The integration can involve a product of the difference $SDP_T$ and a velocity of the variations in the optical properties of a gas through the first beam paths. The integration can provide information about a contribution, $\zeta$, to one of the monitored interferometric phases of the variations in the optical properties of the gas or a spatial derivative of $\zeta$.

The variations of the optical properties of the gas can be related to a local variation in the refractivity of the gas that moves non-parallel to the first beam paths as the local variation in the refractivity of the gas moves through the first beam paths.

In some embodiments, the method further includes using a lithography tool to expose a substrate supported by a moveable stage with radiation while interferometrically monitoring the position or orientation of the stage based on the derived information.

In general, in another aspect, the invention features a system that includes an interferometry assembly configured to provide three different output beams, each output beam including an interferometric phase related to an optical path difference between a corresponding first beam and a corresponding second beam, where the interferometry assembly directs each first beam to contact a measurement object at least once. The system further includes three detectors each positioned in a path of a corresponding output beam and an electronic processor coupled to the detectors, the electronic processor being configured to monitor the three interferometric phases and to derive information about variations in the optical properties of a gas in the measurement beam paths from the three monitored phases.

Embodiments of the system can include one or more of the following features and/or features of other aspects. The system can be configured to perform the methods of other aspects. The interferometry assembly can be configured to direct each of the first beams to contact the measurement object more than once. The interferometry assembly can be configured to direct each of the first beams towards the measurement object at a common location. In some embodiments, the interferometry assembly is configured to direct each of the second beams to contact the measurement object.

The measurement object can be a plane mirror measurement object. The interferometry assembly can define three different interferometer axes where the interferometric phase of each output beam corresponds to a position of the measurement object with respect to a corresponding one of the measurement axes. The interferometer axes can be parallel. In some embodiments, the interferometer axes are coplanar.

The system can include a stage that is moveable with respect to the interferometry assembly, where the measurement object is attached to the stage.

In another aspect, the invention features a lithography system for use in fabricating integrated circuits on a wafer. The lithography system includes the system of the aforementioned aspect, an illumination system for imaging spatially patterned radiation onto a wafer supported by the moveable stage, and a positioning system for adjusting the position of the stage relative to the imaged radiation. The interferometer assembly in the system is configured to monitor the position of the wafer relative to the imaged radiation and electronic processor is configured to use the information about to the variations in the optical properties of the gas to improve the accuracy of the monitored position of the wafer.

In another aspect, the invention features a beam writing system for use in fabricating a lithography mask. The beam writing system includes the system of the aforementioned aspect, a source providing a write beam to pattern a substrate supported by the moveable stage, a beam directing assembly for delivering the write beam to the substrate, a positioning system for positioning the stage and beam directing assembly relative one another. The interferometer assembly is configured to monitor the position of the stage relative to the beam directing assembly and electronic processor is configured to use the information about to the variations in the optical properties of the gas to improve the accuracy of the monitored position of the stage.

In general, in another aspect, the invention features methods that include interferometrically monitoring a distance between an interferometry assembly and a measurement object along each of three different measurement axes by directing three measurement beams along different paths between the interferometry assembly and the measurement object, determining values of a parameter at different times from the monitored distances, wherein for a given position of the measurement object the parameter is based on the distances of the measurement object along each of the three different measurement axes at the given position, and deriving information related to variations in the optical properties of a gas in the measurement beam paths from the parameter values.

Embodiments of the methods can include one or more of the following features and/or features of other aspect of the invention. Deriving the information can include determining a variation of the parameter value from an average parameter value. The average parameter value can correspond to an average of parameter values for the measurement object at the given position. Deriving the information can include integrating the variations of the parameter value over a time period. The method can include using the information related to the variations in the optical properties of the gas to improve the accuracy of measurements made using the interferometry assembly. The method can include using a lithography tool to expose a substrate with radiation passing through a mask while interferometrically monitoring the distance between the interferometry assembly and the measurement object, wherein the position of the substrate or the mask relative to a reference frame is related to the distance between the interferometry assembly and the measurement object. In some embodiments, the interferometer assembly or the measurement object are attached to a stage and at least one of the monitored distances is used to monitor the position of the stage relative to a frame supporting the stage.

In another aspect, the invention features lithography methods for use in fabricating integrated circuits on a wafer, where the methods include supporting the wafer on a moveable stage, imaging spatially patterned radiation onto the wafer, adjusting the position of the stage, and monitoring the position of the stage using the interferometry assembly and the measurement object and using the information related to variations in the optical properties of the gas in the measurement beam paths derived using the methods featured in other aspects of the invention to improve the accuracy of the monitored position of the stage.

In another aspect, the invention features lithography methods for use in the fabrication of integrated circuits that include directing input radiation through a mask to produce spatially patterned radiation, positioning the mask relative to the input radiation, monitoring the position of the mask relative to the input radiation using the interferometry assembly and the measurement object and using information related to variations in the optical properties of the gas in the measurement beam paths derived using the methods featured in other aspects of the invention to improve the accuracy of the monitored position of the mask, and imaging the spatially patterned radiation onto a wafer.

In a further aspect, the invention features lithography methods for fabricating integrated circuits on a wafer that include positioning a first component of a lithography system relative to a second component of a lithography system to expose the wafer to spatially patterned radiation, and monitoring the position of the first component relative to the second component using the interferometry assembly and the measurement object and using the information related to variations in the optical properties of the gas in the measurement beam paths derived using the methods featured in other aspects of the invention to improve the accuracy of the monitored position of the first component.

In a further aspect, the invention features methods for fabricating integrated circuits using the lithography methods featured in other aspects of the invention.

In another aspect, the invention features methods for fabricating a lithography mask, where the methods include directing a write beam to a substrate to pattern the substrate, positioning the substrate relative to the write beam, and monitoring the position of the substrate relative to the write beam using the measurement object and using the information related to variations in the optical properties of the gas in the measurement beam paths derived using the methods featured in other aspects of the invention to improve the accuracy of the monitored position of the substrate.

In general, in a further aspect, the invention features lithography systems for use in fabricating integrated circuits on a wafer, where the systems include a stage for supporting the wafer, an illumination system including a radiation source, a mask, a positioning system, a lens assembly, a first interferometry subsystem configured to monitor the position of the stage along a first axis, a second interferometry subsystem configured to monitor the position of the stage along a second axis orthogonal to the first axis, and a manifold for introducing a gas into the lithography system along a direction non-parallel to the first and second axes, wherein during operation the source directs radiation through the mask to produce spatially patterned radiation, the positioning system adjusts the position of the mask relative to the radiation from the source, the lens assembly images the spatially patterned radiation onto the wafer, and the first and second interferometry subsystems monitor the position of the mask relative to the radiation from the source.

Embodiments of the lithography systems can include one or more of the other features and/or features of other aspects of the invention. The manifold can introduce the gas into the lithography system along a direction that is at about 45 degrees with respect to the first axis. The manifold can introduce the gas into the lithography system along a direction that is at about 45 degrees with respect to the second axis. The first interferometry system can be configured to monitor the position of the stage along at least two other axes in addition to the first axis. The at least two additional axes can be parallel to the first axis. The at least two additional axes can be coplanar with the first axis.

Among other advantages, embodiments include interferometry systems and methods for making extremely accurate measurements of variations in displacement and/or orientation of a measurement object.

Beams and/or axes referred to as being parallel or nominally parallel may deviate from being perfectly parallel to the extent that the effect of the deviation on a measurement is negligible (e.g., less than the required measurement accuracy by about an order of magnitude or more) or otherwise compensated.

Beams and/or axes referred to as being coplanar or nominally coplanar may deviate from being perfectly coplanar to the extent that the effect of the deviation on a measurement is negligible (e.g., less than the required measurement accuracy by about an order of magnitude or more) or otherwise compensated.

Beams and/or axes referred to as being orthogonal or nominally orthogonal may deviate from being perfectly orthogonal to the extent that the effect of the deviation on a measurement is negligible (e.g., less than the required measurement accuracy by about an order of magnitude or more) or otherwise compensated.

Unless otherwise defined, all technical and scientific terms used herein have the same meaning as commonly understood by one of ordinary skill in the art to which this invention belongs. A number of references are incorporated herein by reference. In case of conflict, the present specification will control.

Other features and advantages of the invention will be apparent from the following detailed description.

BRIEF DESCRIPTION OF THE DRAWINGS

FIG. 2b is a schematic plan view of the interferometry system shown in FIG. 2a.

Like reference symbols in the various drawings indicate like elements.

DETAILED DESCRIPTION

Figure 1A:
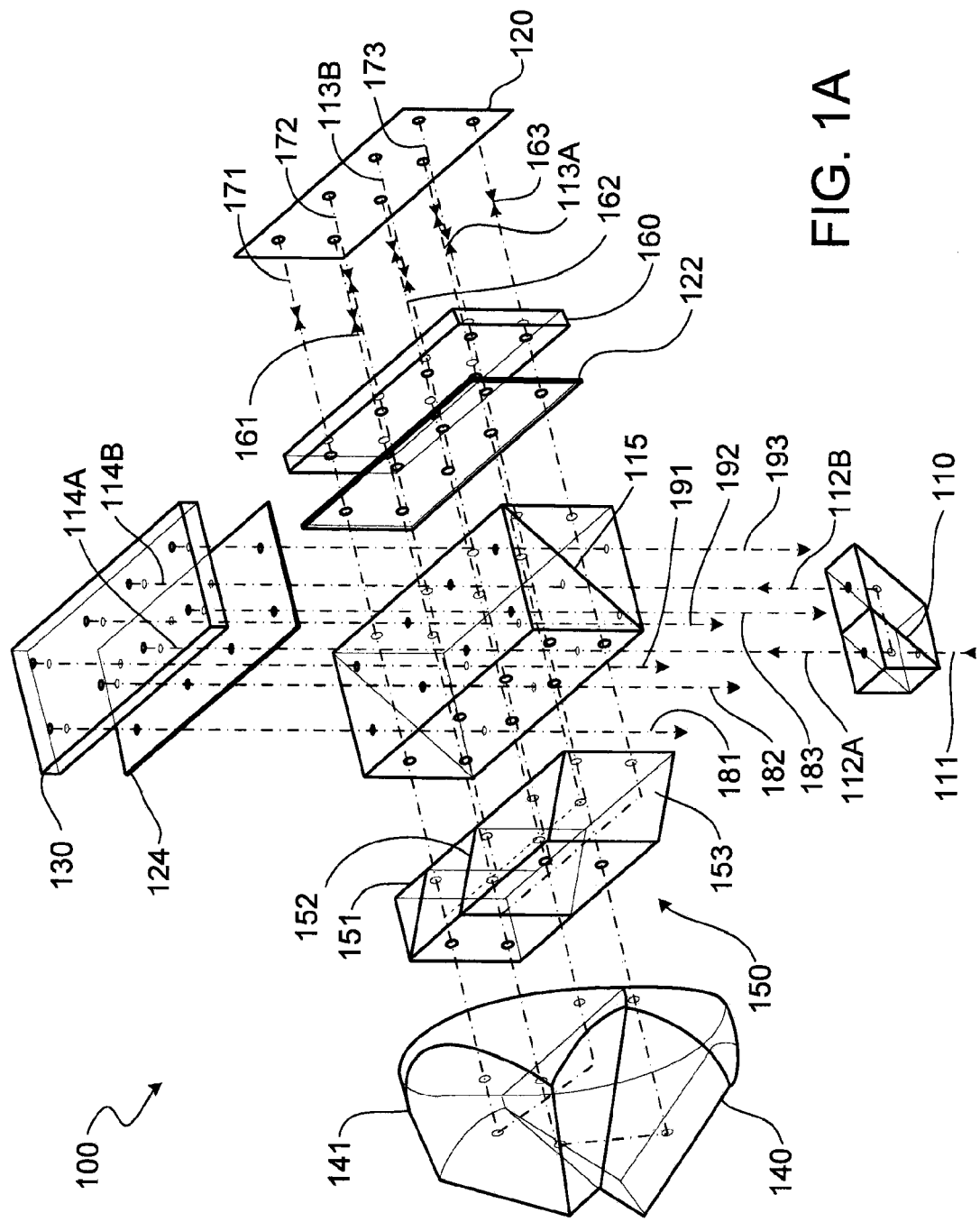
FIG. 1a is an exploded perspective drawing of an interferometer system comprising two three-axes-per-plane interferometers.

FIG. 1a shows an embodiment of a three-axes-per-plane interferometer 100. The interferometer directs multiple measurement beams to each contact a measurement object 120 twice. The measurement object may, for example, be a stage mirror for a wafer stage in a microlithography system. Interferometer 100 produces multiple output beams 181-183 and 191-193 each including interferometric information about changes in distance between the interferometry system and the measurement object along a corresponding measurement axis. Interferometer 100 has the property that the output beams each include a measurement beam component that makes one pass to the measurement object along a common measurement beam path before being directed along separate measurement beam paths for the second pass to the measurement object.

Interferometer 100 includes a non-polarizing beam splitter 110, which splits a primary input beam 111 into two secondary input beams 112A and 112B. Interferometer 100 also includes a polarizing beam splitter 115, which splits secondary input beams 112A and 112B into primary measurement beams 113A and 113B, and primary reference beams 114A and 114B, respectively. Interferometer 100 directs primary measurement beams 113A and 113B along paths that contact measurement object 120 at different locations in a vertical direction. Similarly, primary reference beams 114A and 114B are directed along reference beam paths that contact a reference mirror 130 at different locations. Interferometer 100 also includes quarter wave plates 122 and 124. Quarter wave plate 122 is located between polarizing beam splitter 115 and measurement object 120, while quarter wave plate 124 is located between polarizing beam splitter 115 and the reference mirror. The quarter wave plates rotate by 90° the polarization state of double passed beams directed between the polarizing beam splitter and the measurement object or reference mirror. Accordingly, the polarizing beam splitter transmits an incoming beam that would have been reflected in its out-going polarization state.

The following description pertains to primary measurement beam 113A and primary reference beam 114A. Interferometer 100 directs measurement beam 113B and reference beam 114B along analogous paths. Polarizing beam splitter (PBS) 115 transmits reflected primary measurement beam 113B, which is reflected back towards PBS 115 by a retroreflector 140 (a similar retroreflector 141 reflects primary measurement beam 113B). A compound optical component 150 including non-polarizing beam splitters 151 and 152 and reflector 153 split primary measurement beam 113A into three secondary measurement beams 161, 162, and 163. PBS 115 transmits the three secondary measurement beams, which propagate along paths that contact measurement object 120 at three different positions in a horizontal plane shared by primary measurement beam 113A. PBS 115 then directs the three secondary measurement beams reflected from measurement object 120 along output paths.

PBS 115 reflects primary reference beam 114A towards retroreflector 140. As for the primary measurement beam, optical component 150 splits primary reference beam 114A reflected by retroreflector 140 into three secondary reference beams 171, 172, and 173. PBS 115 reflects secondary reference beams 171, 172, and 173 towards reference mirror 130 along paths at three different positions in a plane shared by primary reference beam 114A. PBS 115 transmits secondary reference beams 171, 172, and 173 reflected from reference object 130 along output paths so that they overlap with measurement beams 161, 162, and 163 to form output beams 181, 182, and 183, respectively. The phase of the output beams carries information about the position of the measurement object along three measurement axes defined by the primary measurement beam's path and the secondary measurement beams' paths.

Interferometer 100 also includes a window 160 located between quarter wave plate 122 and measurement object 120.

Figure 1B:
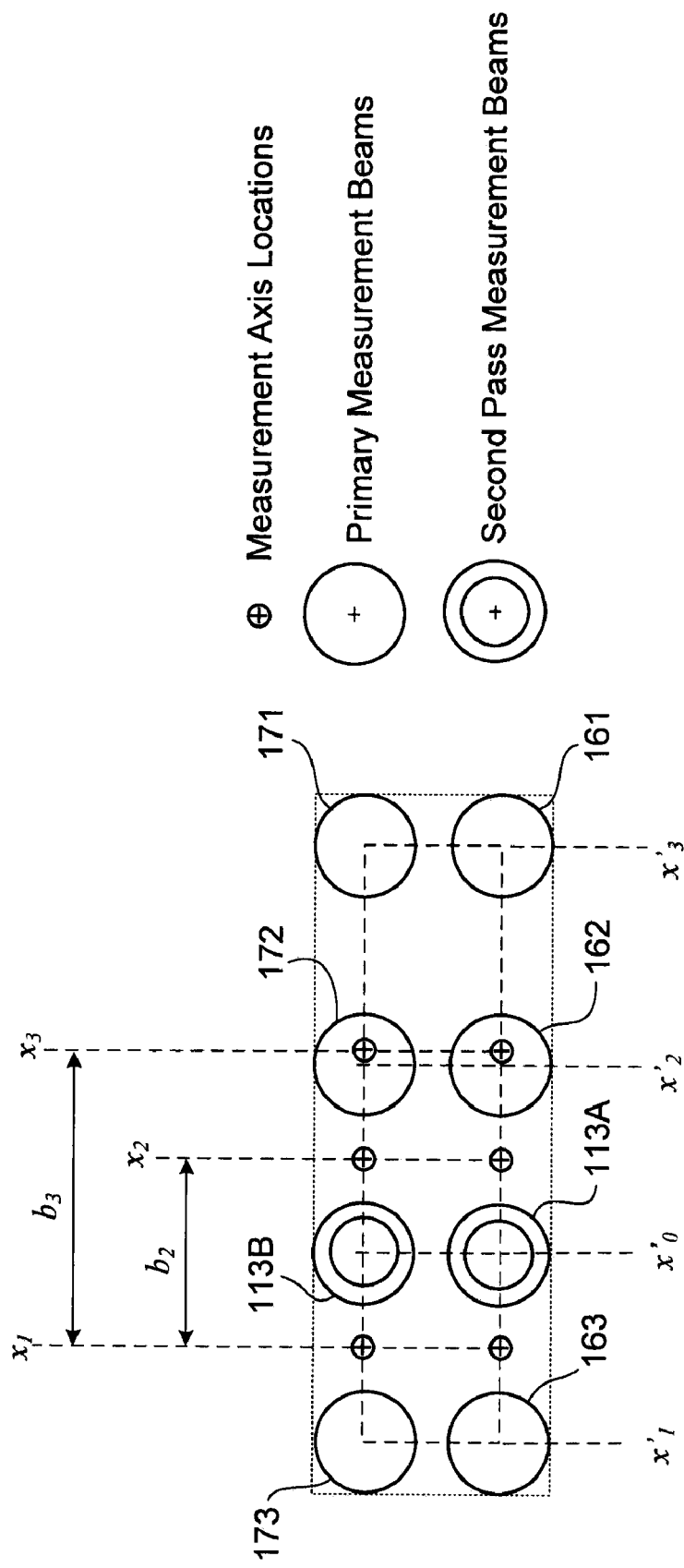
FIG. 1b is a diagram that shows the pattern of measurement beams from interferometer system of FIG. 1a at a stage mirror that serves as measurement object for interferometers of the interferometer system.

The pattern of measurement beams incident on a respective stage mirror is shown in FIG. 1b with the angle of incidence of measurement beams at the stage mirror nominally zero and for the example of measurement axes parallel to the x-axis of a coordinate system. The locations of the measurement axes of the top three-axes-per-plane interferometer corresponding to $x_1$, $x_2$, and $x_3$ are shown in FIG. 1b. The spacing between measurement axes corresponding to $x_1$ and $x_2$ and to $x_1$ and $x_3$ are $b_2$ and $b_3$, respectively. Also shown in FIG. 1b is the location corresponding to the primary single pass measurement beam $x_0'$ and the locations corresponding to the second pass measurement beams $x_1'$, $x_2'$, and $x_3'$. The relationship between a linear displacement measurement corresponding to a double pass to the stage mirror and the linear displacement measurements corresponding to a single pass to the stage mirror is $$x_j = \frac{1}{2}(x_j' + x_0'), \; j = 1, 2, \text{ and } 3. \tag{2}$$

A property of the multiple-axes-per-plane interferometer is that the difference between two linear displacements $x_i$ and $x_j$, $i \neq j$, is independent of $x_0'$, i.e., $$x_i - x_j = \frac{1}{2}(x_i' - x_j'), \; i, j = 1, 2, \text{ and } 3, \; i \neq j. \tag{3}$$

Eq. (3) is an example of a first difference parameter. The difference between two first difference parameters is a second difference parameter (SDP), which for a three-axes-per-plane interferometer, such as interferometer 100, is not sensitive to either a displacement of a respective stage mirror or to the rotation of the stage mirror except through a third order effect involving the angle of stage rotation in a plane defined by the three-axes-per-plane interferometer and departures of the stage mirror surface from a plane. The third order effect is classified as such since it is generated by a geometric effect that is second order in the angle of rotation of the stage mirror and a first order effect in the local apparent rotation of a section of the stage mirror due to the departures of the stage mirror surface from a plane. In general, different combinations of displacement measurements $x_1$, $x_2$, and $x_3$ may be used in the definition of a SDP. One definition of a SDP for an x-axis stage mirror is for example $$SDP(y) \equiv (x_2 - x_1) - \frac{b_2}{b_3 - b_2}(x_3 - x_2) \tag{4}$$

or $$SDP(y) = (x_2 - x_1) - \eta(x_3 - x_2) \tag{5}$$

where $$\eta \equiv \frac{b_2}{b_3 - b_2}. \tag{6}$$

A very important property of SDP is that it can be written in terms of single pass displacements using Equation (3), i.e., $$SDP(y) = \frac{1}{2}[(x_2' - x_1') - \eta(x_3' - x_2')]. \tag{7}$$

A three-axes-per-plane interferometer may be configured so that the linear displacements measured by the three-axes-per-plane interferometer are not affected by certain spatial frequency components of the surface figure error function of a corresponding stage mirror for which SDP is not sensitive.

Figure 2A:
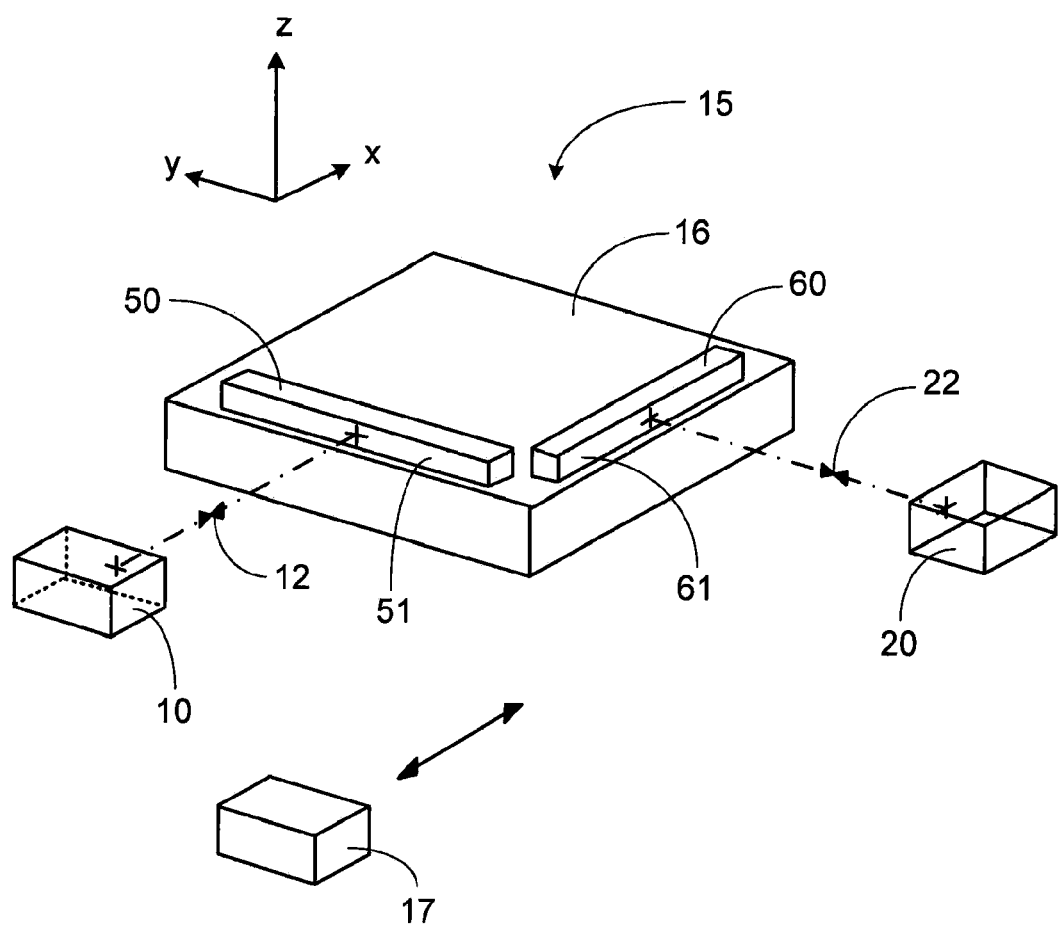
FIG. 2a is a schematic perspective view of an interferometer system that compensates for turbulent effects of gas in a measuring path.
Figure 2B:
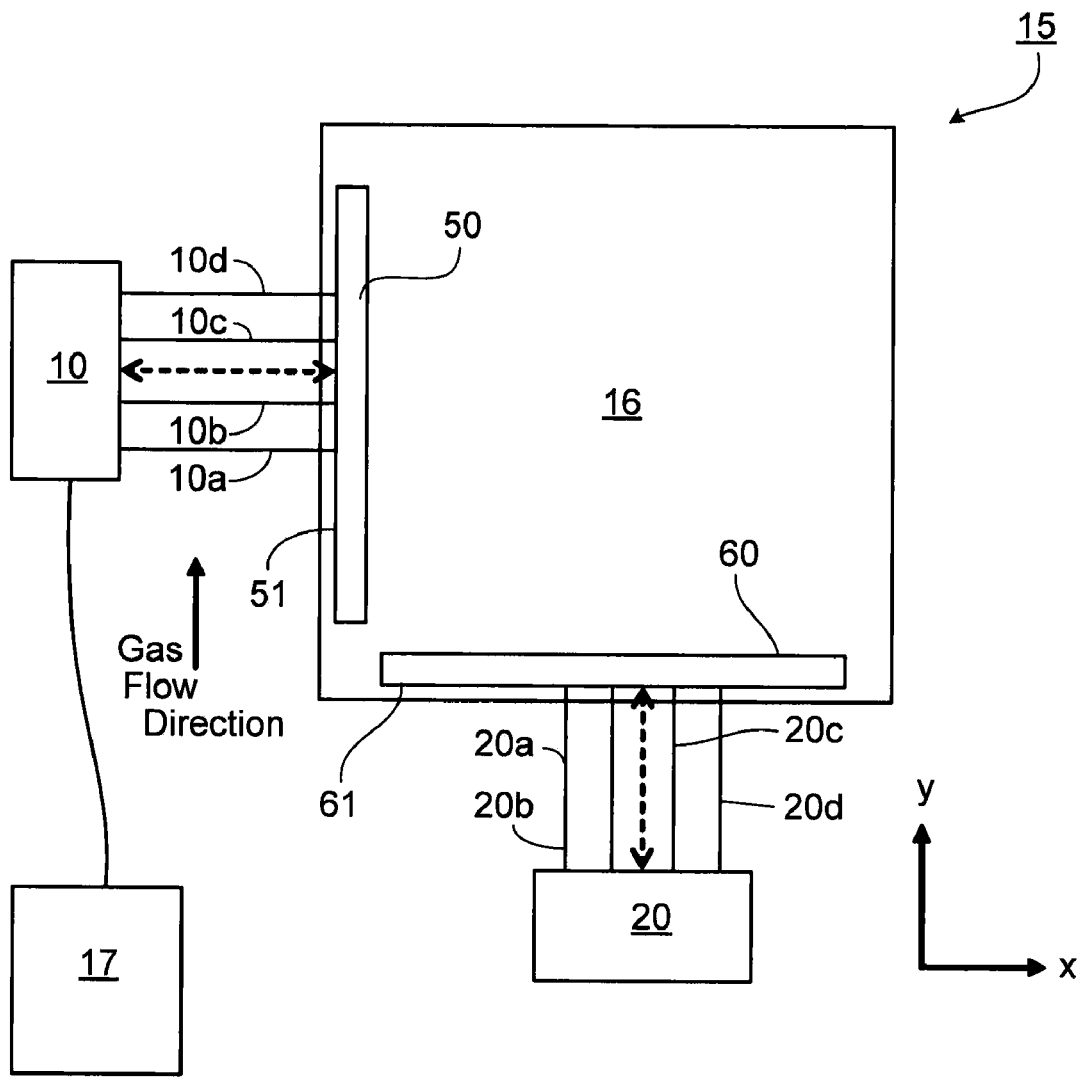

In embodiments, SDP parameters are used in a procedure for a non-dispersive compensation of systematic effects in the refractivity of gas in the measurement and/or reference beam paths. Systematic changes (i.e., non-random changes) in refractivity include effects of changes in gas density and composition. Referring to FIGS. 2a and 2b, such changes may occur, for example, during a lithography tool exposure cycle where, for example, the chamber housing a wafer stage 16 is evacuated and/or purged during the exposure cycle.

FIGS. 2a and 2b, show a perspective and a plan view, respectively, of a lithography tool wafer positioning system 15 that employs a pair of orthogonally arranged interferometers 10 and 20 by which the position and orientation of on-stage mounted stage mirrors 50 and 60, respectively, may be monitored. Measurements made using interferometers 10 and 20 are also used to reduce errors in the monitored position/orientation of the mirrors due to local refractivity variations in the interferometer beam paths.

Stage mirror 50 has a y-z reflective surface 51 elongated in the y-direction. Stage mirror 60 has an x-z reflective surface 61 elongated in the x-direction. Mirrors 50 and 60 are mounted on stage 16 so that their reflective surfaces, 51 and 61, respectively, are nominally orthogonal to one another. Stage 16 is otherwise mounted for nominally plane translation but may experience small angular rotations about the x, y, and z axes due to bearing and drive mechanism tolerances. In normal operation, wafer positioning system 15 is adapted to be operated for scanning in the y-direction for set values of x.

Interferometers 10 and 20 are fixedly mounted off of stage 16. The purpose of interferometer 10 generally is to measure the SDP of reflecting surface 51 and to measure the position of stage 16 in the x-direction and the angular rotations of stage 16 about the y- and z-axes as stage 16 translates in the y-direction. Interferometer 10 includes two three-axes-per-plane interferometers such as interferometer 100 shown in FIG. 1a and arranged so that interferometric beams 10a, 10b, 10c, and 10d travel to and from mirror 50 along optical paths parallel to path 12.

The purpose of interferometer 20 generally is to measure the SDP of reflecting surface 61 and to measure the position of stage 16 in the y-direction and the angular rotations of stage 16 about the x- and z-axes as stage 16 translates in the x-direction. Interferometer 20 comprises two three-axes-per-plane interferometers such as interferometer 100 shown in FIG. 1a and arranged so that interferometric beams 20a, 20b, 20c, and 20d travel to and from mirror 60 along optical paths parallel to path 22.

System 15 also includes an electronic processor 17 (e.g., a computer) which is in communication with interferometers 10 and 20, which receives information from the interferometers and processes that information to determine the relative position and orientation of mirrors 50 and 60, as well as information about local refractivity variations in the path of beams 10a, 10b, 10c, and 10d.

During operation, gas is introduced to the tool in the y-direction. In general, the methods described below are used to correct interferometer measurements for local refractivity variation effects in the beam paths of interferometer 10. In some embodiments, the methods described below can be used to correct interferometer measurements for local refractivity variation effects in the beams paths of both interferometer 10 and interferometer 20. For example, where gas is introduced in a direction that is non-parallel to both the x- and y-axes (e.g., at approximately 45 degrees with respect to the x- and y-axes), measurements from both interferometers can be corrected.

SDP for the x-axis stage mirror are measured as a function of position of the x-axis stage mirror in the y-direction with the corresponding x-axis location and the stage mirror orientation nominally held at fixed values. Also SDP for the y-axis stage mirror are measured as a function of position in the x-direction of the y-axis stage mirror with the corresponding y-axis location and stage orientation nominally held at fixed values. Increased sensitivity to high spatial frequency components of the surface figure of a stage mirror is obtained by measuring the respective SDP with the stage oriented at large pitch angles and large measurement path lengths to the stage mirror, i.e., for large measurement beam shears at the respective measuring three-axes-per-plane interferometer.

The measurements of the respective SDP for the x-axis and y-axis stage mirrors do not require monitoring of changes in stage orientation during the respective scanning of the stage mirrors other than to maintain the stage at a fixed nominal value since SDP is independent of stage mirror orientation except for third order effects.

The values of SDP can be measured either during the normal processing cycle of wafers and/or during periods other than a normal processing cycle of wafers and/or prior to installation of the stage mirrors in a lithography tool.

Improved statistical accuracy in measured values of SDP can be obtained by taking advantage of the relatively low bandwidth of measured values of SDP compared to the bandwidth of the corresponding linear displacement measurements using averaging or low pass filtering.

Interferometer 10 introduces a phase shift $\tilde{\phi}_i$ between the measurement and reference beam components of a beam corresponding to $x_i'$. Phase shift $\tilde{\phi}_i'$ is related to physical lengths of portions of the measurement paths $x_i'$ according to the formulae $$\tilde{\phi}_i' = 2k(x_i' + Z_i' + \zeta_i'), i=0, 1, 2, \text{ and } 3, \quad (8)$$

where $x_i'$ represents the physical length of the of the measurement path i in interferometer 10, wavenumber $k=2\pi/\lambda$, $\lambda$ is the wavelength of the measurement beam, $Z_i'$ is the stationary effect of the gas in the portion of the measurement path, and $\zeta'$ is the contribution of local refractivity variations in the respective portion of the measurement path. An electrical interference signal is generated by detectors by the detection of mixed output beams. The detectors comprise analyzers to mix polarization components of output beams.

The local refractivity variation effects are described by representing the local refractivity variations as an ensemble of cells of gas that move across and in the plane of the measurement paths of beams 10a, 10b, 10c and 10d in interferometer 10. The spatial distribution of a cell m of refractivity $[n(x,y,t)-1]_T$ is represented by a function $f_m(x,y,t)$ such that $$\zeta_i' = \int_{x_i'} [n(x_i', y, t) - 1]_T \, dx_i' \quad (9)$$

$$= \int_{x_i'} \left[ \sum_{m=1} f_m(x_i', y, t) \right] dx_i'.$$

Function $f_m(x_i',y,t)$ is assumed to be a localized function and the form of function $f_m(x_i',y,t)$ may vary from cell to cell. A cell may represent the effect of a non-uniform composition of the gas or the effect of a turbulent eddy.

The phase shifts $\tilde{\phi}_i' + \tilde{\phi}_0'$, i=1, 2, and 3, are derived from electrical interference signals by known techniques used in processing heterodyne signals for phase information. The processing is by either digital or analog signal processes, preferably digital processes, using time-based phase detection such as a digital Hilbert transform phase detector (see, e.g., section 4.1.1 of "Phase-locked loops: theory, design, and applications" 2nd ed. McGraw-Hill (New York) 1993, by R. E. Best) or sliding window finite Fourier transform (FFT) techniques.

The contribution of local refractivity variations to SDP for the stage mirror at nominal position x and y, and at time point T in a repetitive processing cycle, can be expressed by the equation:

$$SDP(x,y,T) = <SDP(x,y,T)> + SDP_T(x,y,T) \quad (8b)$$

where $<SDP(x,y,T)>$ refers to the average value of SDP at x,y,T and $SDP_T(x,y,T)$ is the local refractivity variations component. Equation (8b) recognizes that, over sufficiently long time periods, the contribution $SDP_T$ averages to zero.

The local refractivity variations component $SDP_T$ of SDP can be expressed, using Eq. (7), as $$SDP_T = -\frac{1}{2}\int_{x_1'}(n-1)_T \, dx_1' + \frac{(1+\eta)}{2}\int_{x_2'}(n-1)_T \, dx_2' - \frac{\eta}{2}\int_{x_3'}(n-1)_T \, dx_3'. \quad (10)$$

The effect of the gas turbulent cells on $SDP_T$ is obtained by combining Eqs. (9) and (10) with the result $$SDP_T = -\frac{1}{2}\int_{x_1'}\left[\sum_{m=1}f_m(x_1',y,t)\right]dx_1' + \frac{(1+\eta)}{2}\int_{x_2'}\left[\sum_{m=1}f_m(x_2',y,t)\right]dx_2' - \frac{\eta}{2}\int_{x_3'}\left[\sum_{m=1}f_m(x_3',y,t)\right]dx_3'. \quad (11)$$

The local refractivity variation effects are next represented in Eq. (11) by a Taylor series in the y direction about the $x_2'$ axis. The result is $$SDP_T = -\frac{1}{2}\sum_{m=1}\sum_{p=2}\frac{2^P}{p!}[(-b_2)^P + \eta(b_3-b_2)^P] \int_{x_2'}\left\{\frac{\partial^p f_m(x,y,t)}{\partial y^p}\right\}dx_2'. \quad (12)$$

Using the relationship between $(b_3-b_2)$ and $b_2$ given by Eq. (6), Eq. (12) is rewritten as $$SDP_T = b_2 \sum_{m=1}\sum_{p=2}\frac{(2b_2)^{p-1}}{p!}\left[(-1)^{p-1} - \left(\frac{1}{\eta}\right)^{p-1}\right]\int_{x_2'}\left\{\frac{\partial^p f_m(x,y,t)}{\partial y^p}\right\}dx_2'. \quad (13)$$

Eq. (13) is next written in terms of the local refractivity variation effect $\zeta_i'$ by changing the order of differentiation and integration and using Eq. (9) as $$SDP_T = b_2 \sum_{p=2}\frac{(2b_2)^{p-1}}{p!}\left[(-1)^{p-1} - \left(\frac{1}{\eta}\right)^{p-1}\right]\left(\frac{\partial^p \zeta_2'}{\partial y^p}\right). \quad (14)$$

The first few terms of Eq. (14) are explicitly written out for subsequent use as $$SDP_T = -\frac{1}{2!}\frac{(2b_2)^2}{2}\left(1+\frac{1}{\eta}\right)\left(\frac{\partial^2 \zeta_2'}{\partial y^2}\right) + \frac{1}{3!}\frac{(2b_2)^3}{2}\left(1-\frac{1}{\eta^2}\right)\left(\frac{\partial^3 \zeta_2'}{\partial y^3}\right) - \frac{1}{4!}\frac{(2b_2)^4}{2}\left(1+\frac{1}{\eta^3}\right)\left(\frac{\partial^4 \zeta_2'}{\partial y^4}\right) + \ldots \quad (15)$$

The leading and typically dominant term in the right hand side of Eq. (15) is the second spatial derivative of $\zeta_2'$ for those spatial frequency components of $\zeta_2'$ that have wavelengths $\gg 2\,b_2$. Also note that the contribution of the third spatial derivative of $\zeta_2$ relative to the second spatial derivative is reduced by the factor $$\frac{\eta-1}{\eta+1}. \quad (16)$$

For the example of $\eta=6/5$, the factor of Eq. (16) is 1/6.

Other axes such as $x_1'$ or $x_3'$ could have been chosen as the axis about which to expand in a Taylor series the turbulence effects in Eq. (11) without departing from the scope and spirit of the present invention. Also an axis could have been chosen such that the term corresponding to the third derivative of $\zeta_2$ in Eq. (15) is 0.

Information about the first derivative of the local refractivity variation effects is obtained from the integration with respect to time of Eq. (13) multiplied by a weight function W(t) and u where u is a speed selected to minimize the effects of a non-uniform speed profile along the path of $x_2'$ subsequently discussed with respect to Eq. (20). The value of u will in general be a function of time, i.e. u(t), depending on the position and motion of stage 16. Examples of W(t) are an exponential function $e^{-t/\tau}$ and $$W(t) = \begin{cases} \left(1+\frac{t}{\tau}\right)^q, & -\tau \le t \le 0 \\ 0, & t > 0, t < -\tau \end{cases} \quad (17)$$

where $\tau$ is a constant and q is a positive constant >0, e.g., 1 or 2. It is assumed that each gas cell m is moving across the plane of the $x_i'$ measurement paths with a velocity component $u_m$ perpendicular to the $x_i'$ measurement paths. With this assumption and using a value of q=1 without limiting the scope and spirit of the present invention, the respective integration of Eq. (13) yields the result $$\int_{t-\tau}^{t}\left[1-\left(\frac{t'-t}{\tau}\right)\right]u(t')SDP_T(t')\,dt' = +b_2\sum_{m=1}\sum_{p=2}\frac{u}{u_m}\frac{(2b_2)^{p-1}}{p!}\left[(-1)^{p-1}-\left(\frac{1}{\eta}\right)^{p-1}\right]\int_{x_2'}\left\{\frac{\partial^{p-1}f_m(x_2',y,t')}{\partial y^{p-1}}\right\}dx_2' + b_2\sum_{m=1}\sum_{p=2}\frac{u}{u_m}\frac{(2b_2)^{p-1}}{p!}\left[(-1)^{p-1}-\left(\frac{1}{\eta}\right)^{p-1}\right]\int_{t-\tau}^{t}\left(\frac{1}{\tau}\right)dt'\int_{x_2'}\left\{\frac{\partial^{p-1}f_m(x_2',y,t')}{\partial y^{p-1}}\right\}dx_2'. \quad (18)$$

The velocity component or speed $u_m$ in Eq. (18) which is also in general a function of time is next written as $u+(u_m-u)$ with the result $$\int_{t-\tau}^{t}\left[1-\left(\frac{t'-t}{\tau}\right)\right]u(t')SDP_T(t')dt' = \tag{19}$$

$$+b_2\sum_{m=1}\sum_{p=2}\frac{(2b_2)^{p-1}}{p!}\left[1-\left(\frac{u_m-u}{u}\right)+\left(\frac{u_m-u}{u}\right)^2+\ldots\right]\times$$

$$\left[(-1)^{p-1}-\left(\frac{1}{\eta}\right)^{p-1}\right]\int_{x_2'}\left\{\frac{\partial^{p-1}f_m(x_2',y,t')}{\partial y^{p-1}}\right\}dx_2'+$$

$$b_2\sum_{m=1}\sum_{p=2}\frac{(2b_2)^{p-1}}{p!}\left[1-\left(\frac{u_m-u}{u}\right)+\left(\frac{u_m-u}{u}\right)^2+\ldots\right]\times$$

$$\left[(-1)^{p-1}-\left(\frac{1}{\eta}\right)^{p-1}\right]\int_{t-\tau}^{t}\left(\frac{1}{\tau}\right)dt'$$

$$\int_{x_2'}\left\{\frac{\partial^{p-1}f_m(x_2',y,t')}{\partial y^{p-1}}\right\}dx_2'.$$

Eq. (19) is next written in terms of the local refractivity variations effect $\zeta_i'$ using Eq. (9) to obtain the formula $$\int_{t-\tau}^{t}\left[1-\left(\frac{t'-t}{\tau}\right)\right]u(t')SDP_T(t')dt' = \tag{20}$$

$$+b_2\sum_{p=2}\frac{(2b_2)^{p-1}}{p!}\left[(-1)^{p-1}-\left(\frac{1}{\eta}\right)^{p-1}\right]\frac{\partial^{p-1}\zeta_2'}{\partial y^{p-1}}+$$

$$b_2\sum_{m=1}\sum_{p=2}\frac{(2b_2)^{p-1}}{p!}\left[(-1)^{p-1}-\left(\frac{1}{\eta}\right)^{p-1}\right]\times$$

$$\left[-\left(\frac{u_m-u}{u}\right)+\left(\frac{u_m-u}{u}\right)^2+\ldots\right]\frac{\partial^{p-1}}{\partial y^{p-1}}\int_{x_2'}f_m(x_2',y,t')dx_2'+$$

$$b_2\sum_{p=2}\frac{(2b_2)^{p-1}}{p!}\left[(-1)^{p-1}-\left(\frac{1}{\eta}\right)^{p-1}\right]\frac{\partial^{p-1}}{\partial y^{p-1}}\int_{t-\tau}^{t}\zeta_2'dt'+$$

$$b_2\sum_{m=1}\sum_{p=2}\frac{(2b_2)^{p-1}}{p!}\left[(-1)^{p-1}-\left(\frac{1}{\eta}\right)^{p-1}\right]\times$$

$$\left[-\left(\frac{u_m-u}{u}\right)+\left(\frac{u_m-u}{u}\right)^2+\ldots\right]$$

$$\int_{t-\tau}^{t}\left(\frac{1}{\tau}\right)dt'\int_{x_2'}\left\{\frac{\partial^{p-1}f_m(x_2',y,t')}{\partial y^{p-1}}\right\}dx_2'.$$

There are on the right hand side of Eq. (20) a first and second single series in p and a first and second double series wherein both are in m and p. The first single series in p with the first few terms of the respective series explicitly written out for subsequent use is given by the formula $$b_2\sum_{p=2}\frac{(2b_2)^{p-1}}{p!}\left[(-1)^{p-1}-\left(\frac{1}{\eta}\right)^{p-1}\right]\frac{\partial^{p-1}\zeta_2'}{\partial y^{p-1}} = \tag{21}$$

$$-\frac{1}{2!}\frac{(2b_2)^2}{2}\left(1+\frac{1}{\eta}\right)\left(\frac{\partial\zeta_2'}{\partial y}\right)+\frac{1}{3!}\frac{(2b_2)^3}{2}\left(1-\frac{1}{\eta^2}\right)\left(\frac{\partial^2\zeta_2'}{\partial y^2}\right)-$$

$$\frac{1}{4!}\frac{(2b_2)^4}{2}\left(1+\frac{1}{\eta^3}\right)\left(\frac{\partial^3\zeta_2'}{\partial y^3}\right)+\ldots$$

The leading and typically dominant term in the right hand side of Eq. (21) is the first spatial derivative of $\zeta_2'$ for those spatial frequency components of $\zeta_2'$ that have wavelengths $>>2\,b_2$. Also note that the contribution of the second spatial derivative of $\zeta_2$ relative to the first spatial derivative is reduced by the factor given by Eq. (16).

The second single series in p represents spatial derivatives of the temporal average of $\zeta_2$ over period $\tau$. Thus the average value of the second single series in p is 0 and has a variance that is reduced by the number of statistically independent values of $\zeta_2$ that exist for the measurement beam paths in time $\tau$. The number will be a function of the characteristic size of the turbulence cells, i.e. the variance will be reduced by a factor proportional to the characteristic size of the turbulence cells. For example, for cells with a characteristic size of 2 cm, $\tau=2$ sec, and $u_m=50$ cm/sec, the number is $\cong 50$ or the corresponding statistical error is reduced by a factor of $50^{1/2}\cong 7$.

The magnitude of the first double series in m and p in Eq. (20) is reduced as a consequence of only the deviation of $u_m$ from u appears as a factor. In particular, the magnitude of the first double series in m and p can be used to define the best value to use for u(t), e.g., the value of u(t) is chosen such that the standard deviation of the magnitude of the first double series in m and p is a minimum. With the first order term in $(u_m-u)/u$ eliminated statistically, the largest term remaining will generally be the second order term in $(u_m-u)/u$, i.e. $[(u_m-u)/u]^2$. This greatly reduces sensitivity to variations of $u_m$ along the measurement path $x_2'$. Consider for example the case where the distribution function of $(u_m-u)/u$ is a rectangle function $0.6\leq u_m/u\leq 1.4$. The respective average value $<[(u_m-u)/u]^2>$ of $[(u_m-u)/u]^2$ is $$\langle[(u_m-u)/u]^2\rangle\cong\frac{(0.4)^2}{3}\cong 0.05. \tag{22}$$

The magnitude of the second double series in m and p in Eq. (20) is reduced as a consequence of the two properties and the elimination of terms that are first order in $(u_m-u)/u$ and therefore reduced to a second order effect. The two properties are the effects of temporal averaging $\zeta_2$ as discussed with respect to the second single series p and the effects of only the deviation of $u_m$ from a u appears as a factor leading to the elimination of terms that are first order in $(u_m-u)/u$ such as discussed with respect to the first double series in m and p.

Thus the first spatial derivative of $\zeta_2'$ for those spatial frequency components of $\zeta_2'$ that have wavelengths $>>2\,b_2$ is the leading dominant term on the right side of Eq. (20) as well as the right hand side of Eq. (21). The first few terms of Eq. (20) are explicitly written out for subsequent use as $$\int_{t-\tau}^{t}\left[1-\left(\frac{t'-t}{\tau}\right)\right]u(t')SDP_T(t')dt' = \tag{23}$$

$$-\frac{1}{2!}\frac{(2b_2)^2}{2}\left(1+\frac{1}{\eta}\right)\left(\frac{\partial\zeta_2'}{\partial y}\right)+\frac{1}{3!}\frac{(2b_2)^3}{2}\left(1-\frac{1}{\eta^2}\right)\left(\frac{\partial^2\zeta_2'}{\partial y^2}\right)-$$

$$\frac{1}{4!}\frac{(2b_2)^4}{2}\left(1+\frac{1}{\eta^3}\right)\left(\frac{\partial^3\zeta_2'}{\partial y^3}\right)+\ldots$$

Information about the atmospheric turbulence effect $\zeta_2'(t)$ on the optical path length of path $x_2'$ is obtained from the derived value of first spatial derivative of the local refractivity variation effects given by Eqs. (20) and (21) by the same procedure that was described for obtaining information about the of first spatial derivative of the local refractivity variation effects from the second spatial derivative of the local refractivity variation effects. The result is given by the following formula $$\int_{t-\tau}^{t}\left[1-\left(\frac{t'-t}{\tau}\right)\right]u(t')dt'\int_{t'-\tau}^{t'}\left[1-\left(\frac{t''-t'}{\tau}\right)\right]u(t'')SDP_T(t'')dt'' = \quad (24)$$

$$+b_2\sum_{p=2}\frac{(2b_2)^{p-1}}{p!}\left[(-1)^{p-1}-\left(\frac{1}{\eta}\right)^{p-1}\right]\frac{\partial^{p-2}\zeta_2'}{\partial y^{p-2}} +$$

$$b_2\sum_{m=1}\sum_{p=2}\frac{(2b_2)^{p-1}}{p!}\left[(-1)^{p-1}-\left(\frac{1}{\eta}\right)^{p-1}\right]\times\left[-\left(\frac{u_m-u}{u}\right)+\right.$$

$$\left.\left(\frac{u_m-u}{u}\right)^2+\ldots\right]\frac{\partial^{p-2}}{\partial y^{p-2}}\int_{x_2'}f_m(x_2',y,t')dx_2' +$$

$$b_2\sum_{p=2}\frac{(2b_2)^{p-1}}{p!}\left[(-1)^{p-1}-\left(\frac{1}{\eta}\right)^{p-1}\right]\frac{\partial^{p-2}}{\partial y^{p-2}}$$

$$\int_{t-\tau}^{t}\left(\frac{1}{\tau}\right)dt'\int_{t'-\tau}^{t'}\zeta_2'dt''+\ldots$$

The first few terms of Eq. (24) are explicitly written out for subsequent use as $$\int_{t-\tau}^{t}\left[1-\left(\frac{t'-t}{\tau}\right)\right]u(t')dt'\int_{t'-\tau}^{t'}\left[1-\left(\frac{t''-t'}{\tau}\right)\right]u(t'')SDP_T(t'')dt'' = \quad (25)$$

$$-\frac{1}{2!}\frac{(2b_2)^2}{2}\left(1+\frac{1}{\eta}\right)\zeta_2' + \frac{1}{3!}\frac{(2b_2)^3}{2}\left(1-\frac{1}{\eta^2}\right)\left(\frac{\partial\zeta_2'}{\partial y}\right) -$$

$$\frac{1}{4!}\frac{(2b_2)^4}{2}\left(1+\frac{1}{\eta^3}\right)\left(\frac{\partial^2\zeta_2'}{\partial y^2}\right) + \ldots$$

The omitted terms in Eq. (25) are reduced by first and higher effects such as described in relation to the reduction of the magnitudes of terms in Eq. (20) due to time averaging and the $(u_m-u)/u$ factor.

Values of $\zeta_2'(t)$, $\partial\zeta_2'(t)/\partial y$, and $\partial^2\zeta_2'(t)/\partial y^2$ can be obtained from combinations of Eqs. (15), (23), and (25). For example, in some embodiments, $\zeta_2'(t)$ is determined from Eq. (25) by assuming all but the first term on the right hand side of the equation (i.e., the term in $\zeta_2'(t)$) are negligible. In this case, $\zeta_2'(t)$ is determined by dividing the integral by $$-\frac{1}{2!}\frac{(2b_2)^2}{2}\left(1+\frac{1}{\eta}\right).$$

In certain embodiments, $\zeta_2'(t)$ and $\partial\zeta_2'(t)/\partial y$ are determined from Eqs. (23) and (25) by treating all terms in $\partial^2\zeta_2'(t)/\partial y^2$ and higher order spatial derivatives as negligible. $\partial\zeta_2'(t)/\partial y$ can be determined from Eq. (23), which can then be used to more accurately determined $\zeta_2'(t)$ from Eq. (25).

In some embodiments, values of $\zeta_2'(t)$, $\partial\zeta_2'(t)/\partial y$, and $\partial^2\zeta_2'(t)/\partial y^2$ are obtained from Eqs. (15), (23), and (25), where all terms in third order spatial derivatives and higher are assumed to be negligible.

Values of $\zeta_2'(t)$, $\partial\zeta_2'(t)/\partial y$, and/or $\partial^2\zeta_2'(t)/\partial y^2$ are subsequently used to correct for the effects of local refractivity variations in measurement path $x_i'$, $i=0, 1, 2, 3$, or some other path displaced from $x_2'$ based on Eq. (8). Alternatively, or additionally, the values of $\zeta_2'(t)$, $\partial^2\zeta_2'(t)/\partial y$, and/or $\partial^2\zeta_2'(t)/\partial y^2$ can be used to correct measurements of pitch and/or yaw measurements of stage 16 made using the interferometry system. Furthermore, in some embodiments, the values of $\zeta_2'(t)$, $\partial\zeta_2'(t)/\partial y$, and/or $\partial^2\zeta_2'(t)/\partial y^2$ can be used to correct measurements of SDP and/or information about the system determined from the measurement SDP values (e.g., information about the surface profile of the measurement object).

In general, the gas velocity function, $u(t)$, can be obtained using one or more of a variety of techniques. These techniques include both empirical techniques and computational techniques.

Examples of empirical techniques include monitoring the interferometric variations in the distance between two of the axes of a three-axes-per-plane interferometer in the system when the stage is stationary. Since the stage is not moving, these variations can be attributed to gas cells passing through the measurement beams. Correlating measurement variations between two different axes yields a characteristic travel time for a gas cell between the two axes. Accordingly, if the distance between the two axes is known, a characteristic velocity can be determined from the characteristic travel time.

In some embodiments, gas velocity sensors can be installed in the system to monitor gas velocity patterns during a processing cycle of the system. The sensor measurements can be used to develop a gas velocity profile for the system, which can be used in subsequent processing cycles to determine x. Alternatively, or additionally, gas velocity information can be determined using sensors and used real-time to make the air turbulence correction.

Another way to determine the gas velocity function is using computational methods such as computational fluid dynamics programs. One example of such a program is Star CD, commercially available from the CD adapco Group (Melville, N.Y.). In general, computational fluid dynamics solve fluid dynamics problems in complex systems by solving one or more sets of differential equations relating parameters of the fluid (e.g., density, temperature) at a set of discrete locations and times within the system. For example, for an incompressible fluid, one might use the Navier-Stokes equation, which is the fundamental partial differential equation that describes the flow of such fluids. The set of discrete locations, often referred to as a mesh, is usually defined according to the physical structure of the system. The differential equation(s) usually requires a set of user-defined boundary values describing, e.g., initial system conditions to be entered prior to solving. These can include boundary conditions for any parameter, such as an initial temperature profile, or the temperature of certain portions of the mesh at particular times during a cycle.

Accordingly, by determining an appropriate mesh and entering conditions for the processing cycle, one can computationally determine values of the gas velocity and/or other parameters at different locations in the system during the cycle.

Figure 3:
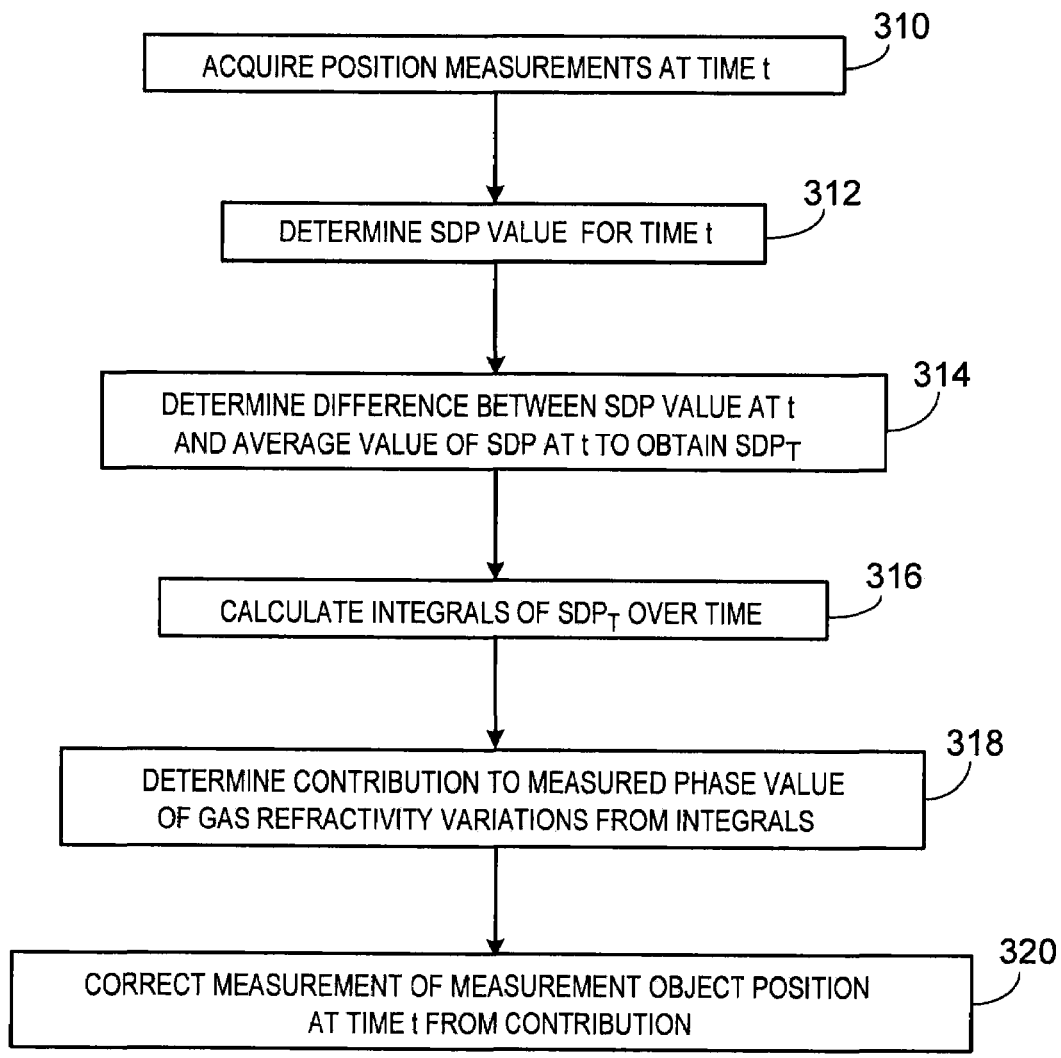
FIG. 3 is a flow chart summarize a method for determining information about gas refractivity variations between an interferometer and a measurement object.

FIG. 3 shows a flow chart that summarizes a process for determining the contribution of local refractivity variations to an interferometer phase measurement. As an initial step 310, the interferometer is used to acquire a measurement of the position of the measurement object along the three measurement axes at a time t. In step 312, the position measurements are used to determine an SDP value for time t. Next, in step 314, the contribution of local gas refractivity variations to SDP is determined from the difference between the SDP value measured at t, and an average SDP value for time t in the wafer exposure cycle. This difference, $SDP_T(t)$, is used to compute integrals according to Equations (23) and/or (25) in next step 316 which provides information about $\zeta'$ and spatial derivatives of $\zeta'$. In step 316, these integrals are determined using a pre-established velocity function, u(t), and a weighting function, W(t). In step 318, the contribution to the measured phase at time t is calculated from $\zeta'$ and the spatial derivatives of $\zeta'$. Finally, at step 320, the determined contribution to the measured phase by the local gas refractivity variations is used to correct the measurement of the position of the measurement object along one of the axes at time t. This correction can be done contemporaneously to the position measurement or at some later time. Alternatively, or additionally, the determined contribution to the measured phase by the local gas refractivity can be used to correct other measurements, such as a measurement of the angular orientation of the measurement object, or SDP values for the measurement object.

Furthermore, in some embodiments, measurements from both planes of interferometer axes in interferometer 100 (i.e., the first plane corresponding to beams 171, 172, and 173, and the second plane corresponding to beams 161, 162, and 163) can be used to determine information about local gas refractivity variations. For example, the procedures described above can be performed independently for both sets of axes, providing information about the local gas refractivity variations in each corresponding plane. In some embodiments, this information can be correlated to provide information about the movement of the gas refractivity variations out of the interferometer axes planes.

Moreover, while the foregoing description is with regard to a particular interferometer assembly, namely interferometer 100, in general, other assemblies can be used to obtain values for a SDP. For example, in some embodiments, an interferometer assembly can be configured to monitor the position of a measurement object along more than three coplanar axes (e.g., four or more axes, five or more axes). Moreover, while interferometer includes non-coplanar measurement axes, other embodiments can include exclusively coplanar axes. Furthermore, the relative position of the common measurement beam path is not limited to the position in interferometer 100. For example, in some embodiments, the common measurement beam path can be an outermost path, instead of being flanked by beam paths on either side within the common plane.

In some embodiments, interferometers that provide measurements along non-coplanar axes can be used. For example, where the cells corresponding to local refractivity variations extend some distance out of the plane formed by the measurement beam paths of the interferometer, the interferometer axes can be non-coplanar and still be used to provide information about the refractivity variations as described above. Generally, the amount by which measurement axes are displaced from being coplanar should be less than the space extended by the cell so that the cell passes through the measurement beams for each axis.

While for each axis in interferometer 100, interferometer 100 directs a measurement beam to contact the measurement object twice and directs a reference beam to contact a reference object twice, in some embodiments interferometers can be used that direct both beams to contact the measurement object. For example, in some embodiments, an interferometer can be used that directs both beams to contact both the reference and measurement objects once. For each axis, such interferometers provide information about the difference between the position of the measurement object where each of the two beam's strike relative to the measurement axis, rather than the average position of the measurement object where each of the two beams strike as in a conventional double-pass displacement measuring interferometer. In other words, while the phase of each output beam in interferometer 100 is related to $(x_j'+x_0')$, as indicated in Eq. (3), in this other type of interferometer the phase of each output beam is related to $(x_j'-x_0')$. First and second difference parameters can be determined from these measurements in a similar way to that described above. Examples of interferometers that direct both beams to contact the measurement and reference objects are described in U.S. Pat. No. 6,819,434, by Henry, A. Hill and entitled "MULTIPLE DEGREE OF FREEDOM INTERFEROMETER, the entire contents of which is hereby incorporated by reference.

In certain embodiments, individual, rather than compound, optical components can be used. For example, free-standing beam splitters can be used to divide the first path measurement beam into the other measurement beams. Such a configuration may allow one to adjust the relative spacing of the beams, and hence the relative spacing of the measurement axes in a multi-axis interferometer.

In some embodiments, multiple single-axis interferometers can be used instead of a multi-axis interferometer. For example, where the cell sizes are greater than or approximately the same as the beam separation of corresponding two single pass measurement beam paths of a single axis interferometer, a three-axis-per-plane interferometer can be replaced by three single axis interferometers (e.g., high stability plane mirror interferometers), arranged so that each interferometer's axis lies in a common plane.

Other forms of a plane mirror configurations, such as described in an article entitled "Differential interferometer arrangements for distance and angle measurements: Principles, advantages and applications" by C. Zanoni, *VDI Berichte* Nr. 749, 93-106 (1989) may be used in addition or alternatively to the interferometer described above.

Embodiments of further interferometers and interferometry systems are disclosed, for example, in U.S. Pat. No. 6,757,066, entitled "MULTIPLE DEGREE OF FREEDOM INTERFEROMETER" U.S. Pub. No. US 2005-0146727 A1, entitled "MULTI-AXIS INTERFEROMETERS AND METHODS AND SYSTEMS USING MULTI-AXIS INTERFEROMETERS," filed on Jan. 6, 2005; U.S. Pub. No. 2005-0146727 A1, entitled "MULTI-AXIS INTERFEROMETERS AND METHODS AND SYSTEMS USING MULTI-AXIS INTERFEROMETERS"; as well as those applications referenced above in relation to measuring offset errors.

In embodiments, various other error compensation techniques can be used to reduce other sources of error in interferometer measurements. For example, stationary effects of the gas flow in Equation (8) can be compensated by signal processing using known/measured properties of the stationary effects such as described in the cited U.S. Pat. No. 6,842,256 and U.S. Pub. No. 2005 0237536 A1. The compensation of stationary or systematic effects may also be done in part by use of a wavelength monitor such as described in commonly owned U.S. Pat. No. 4,685,803 and U.S. Pat. No. 4,733,967. Both of the patents are by G. E. Sommargren and the contents thereof are herein incorporated in their entirety by reference.

In some embodiments, the effects of offset errors in the measured values of SDP can be measured by use of procedures described in U.S. Pub. No.'s US 2005 0248772 A1 and 2005 0237536 A1. Details for determining surface figure are also described in U.S. Pub. No. 2005 0162664 A1 and U.S. Pub. No. 2005-0146727 A1. The contents of the four aforementioned publications are all hereby incorporated by reference in their entirety.

In certain embodiments, cyclic errors in interferometer measurements can also be compensated. Cyclic errors that are present in the linear displacement measurements can be reduced (e.g., eliminated) and/or compensated by use of one of more techniques such as described in U.S. Pat. No. 6,891,624, entitled "CYCLIC ERROR REDUCTION IN AVERAGE INTERFEROMETRIC MEASUREMENTS," and U.S. Pat. No. 6,950,192, entitled "CYCLIC ERROR COMPENSATION IN INTERFEROMETRY SYSTEMS," both of which are by Henry A. Hill and the contents of which are incorporated herein in their entirety by reference.

An example of another cyclic error compensation technique is described in commonly owned U.S. patent application Ser. No. 6,806,961, entitled "INTERFEROMETRIC CYCLIC ERROR COMPENSATION," by Henry A. Hill, the contents of which are incorporated herein in their entirety by reference.

Another example of a cyclic error compensation technique is described in U.S. Pat. No. 6,778,280, entitled "INTERFEROMETRY SYSTEM AND METHOD EMPLOYING AN ANGULAR DIFFERENCE IN PROPAGATION BETWEEN ORTHOGONALLY POLARIZED INPUT BEAM COMPONENTS," by Henry A. Hill and Peter de Groot, the contents of which are incorporated herein in their entirety by reference.

A further example of a cyclic error compensation technique is described in U.S. Pat. No. 6,806,962, entitled "TILTED INTERFEROMETER," by Henry A. Hill, the contents of which is herein incorporated in their entirety by reference.

Other techniques for cyclic error compensation include those described in U.S. Pat. No. 6,137,574 entitled "SYSTEMS AND METHODS FOR CHARACTERIZING AND CORRECTING CYCLIC ERRORS IN DISTANCE MEASURING AND DISPERSION INTERFEROMETRY;" U.S. Pat. No. 6,252,668 B1, entitled "SYSTEMS AND METHODS FOR QUANTIFYING NON-LINEARITIES IN INTERFEROMETRY SYSTEMS;" and U.S. Pat. No. 6,246,481, entitled "SYSTEMS AND METHODS FOR QUANTIFYING NONLINEARITIES IN INTERFEROMETRY SYSTEMS," wherein all three are by Henry A. Hill, the contents of the three above-cited patents and patent applications are herein incorporated in their entirety by reference.

As discussed, lithography tools are especially useful in lithography applications used in fabricating large scale integrated circuits such as computer chips and the like. Lithography tools are also used in fabricating flat panel display panels, such as liquid crystal display panels. Lithography is the key technology driver for the semiconductor manufacturing industry. Overlay improvement is one of the five most difficult challenges down to and below 100 nm line widths (design rules), see, for example, the *Semiconductor Industry Roadmap*, p. 82 (1997).

Overlay depends directly on the performance, i.e., accuracy and precision, of the distance measuring interferometers used to position the wafer and reticle (or mask) stages. Since a lithography tool may produce $50-100M/year of product, the economic value from improved performance distance measuring interferometers is substantial. Each 1% increase in yield of the lithography tool results in approximately $1M/year economic benefit to the integrated circuit manufacturer and substantial competitive advantage to the lithography tool vendor. The methods and apparatus described above can improve overlay by reducing stage positioning errors associate with local refractivity variations in a lithography tool.

The function of a lithography tool is to direct spatially patterned radiation onto a photoresist-coated wafer. The process involves determining which location of the wafer is to receive the radiation (alignment) and applying the radiation to the photoresist at that location (exposure).

To properly position the wafer, the wafer includes alignment marks on the wafer that can be measured by dedicated sensors. The measured positions of the alignment marks define the location of the wafer within the tool. This information, along with a specification of the desired patterning of the wafer surface, guides the alignment of the wafer relative to the spatially patterned radiation. Based on such information, a translatable stage supporting the photoresist-coated wafer moves the wafer such that the radiation will expose the correct location of the wafer.

During exposure, a radiation source illuminates a patterned reticle, which scatters the radiation to produce the spatially patterned radiation. The reticle is also referred to as a mask, and these terms are used interchangeably below. In the case of reduction lithography, a reduction lens collects the scattered radiation and forms a reduced image of the reticle pattern. Alternatively, in the case of proximity printing, the scattered radiation propagates a small distance (typically on the order of microns) before contacting the wafer to produce a 1:1 image of the reticle pattern. The radiation initiates photochemical processes in the resist that convert the radiation pattern into a latent image within the resist.

Interferometry metrology systems, such as those discussed previously, are important components of the positioning mechanisms that control the position of the wafer and reticle, and register the reticle image on the wafer. If such interferometry systems include the features described above, the accuracy of distances measured by the systems can be increased and/or maintained over longer periods without offline maintenance, resulting in higher throughput due to increased yields and less tool downtime.

In general, the lithography system, also referred to as an exposure system, typically includes an illumination system and a wafer positioning system. The illumination system includes a radiation source for providing radiation such as ultraviolet, visible, x-ray, electron, or ion radiation, and a reticle or mask for imparting the pattern to the radiation, thereby generating the spatially patterned radiation. In addition, for the case of reduction lithography, the illumination system can include a lens assembly for imaging the spatially patterned radiation onto the wafer. The imaged radiation exposes resist coated onto the wafer. The illumination system also includes a mask stage for supporting the mask and a positioning system for adjusting the position of the mask stage relative to the radiation directed through the mask. The wafer positioning system includes a wafer stage for supporting the wafer and a positioning system for adjusting the position of the wafer stage relative to the imaged radiation. Fabrication of integrated circuits can include multiple exposing steps. For a general reference on lithography, see, for example, J. R. Sheats and B. W. Smith, in *Microlithography: Science and Technology* (Marcel Dekker, Inc., New York, 1998), the contents of which is incorporated herein by reference.

Interferometry systems described above can be used to precisely measure the positions of each of the wafer stage and mask stage relative to other components of the exposure system, such as the lens assembly, radiation source, or support structure. In such cases, the interferometry system can be attached to a stationary structure and the measurement object attached to a movable element such as one of the mask and wafer stages. Alternatively, the situation can be reversed, with the interferometry system attached to a movable object and the measurement object attached to a stationary object.

More generally, such interferometry systems can be used to measure the position of any one component of the exposure system relative to any other component of the exposure system, in which the interferometry system is attached to, or supported by, one of the components and the measurement object is attached, or is supported by the other of the components.

Figure 4:
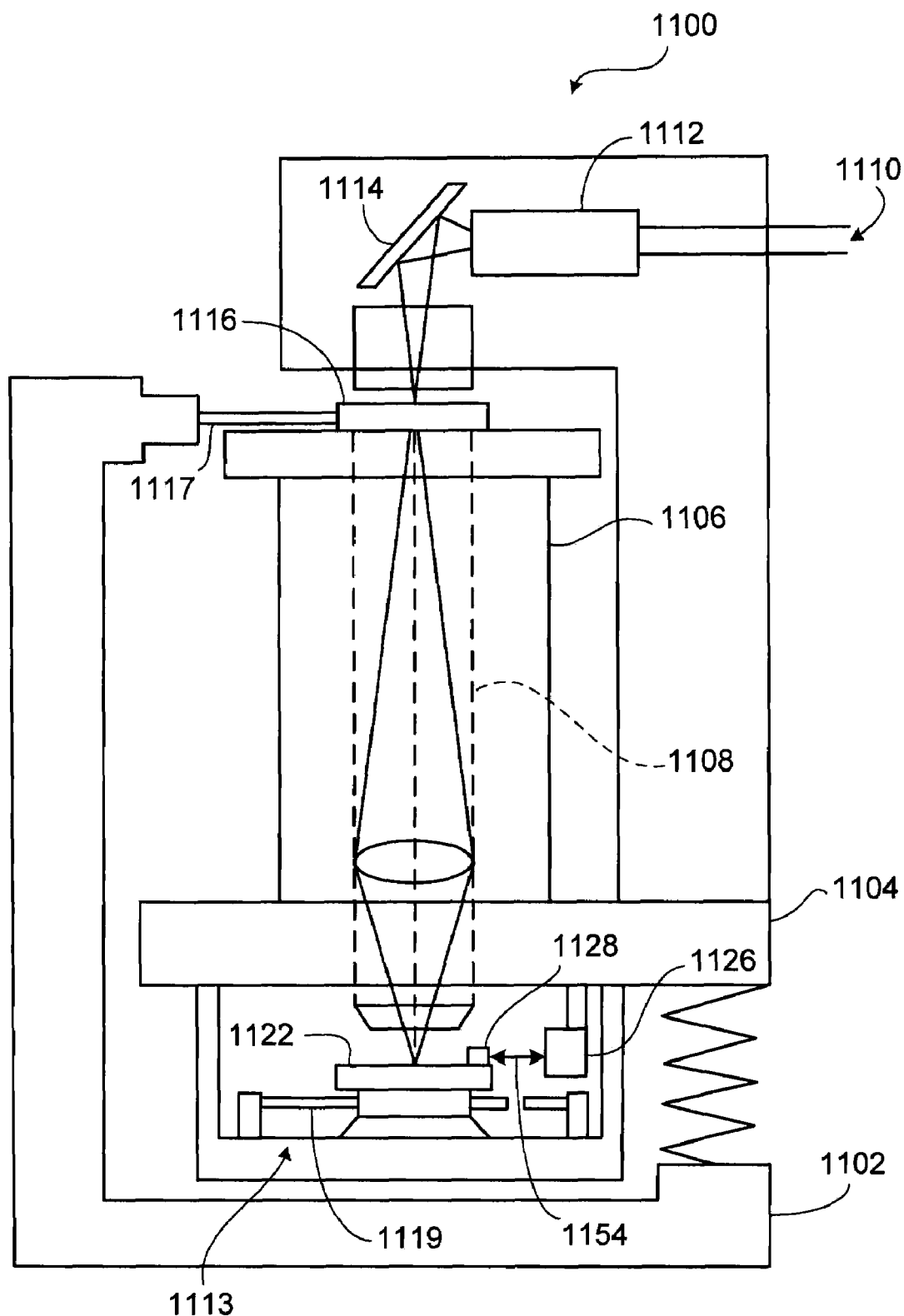
FIG. 4 is a schematic diagram of an embodiment of a lithography tool that includes an interferometer.

Another example of a lithography tool 1100 using an interferometry system 1126 is shown in FIG. 4. The interferometry system is used to precisely measure the position of a wafer (not shown) within an exposure system. Here, stage 1122 is used to position and support the wafer relative to an exposure station. Scanner 1100 includes a frame 1102, which carries other support structures and various components carried on those structures. An exposure base 1104 has mounted on top of it a lens housing 1106 atop of which is mounted a reticle or mask stage 1116, which is used to support a reticle or mask. A positioning system for positioning the mask relative to the exposure station is indicated schematically by element 1117. Positioning system 1117 can include, e.g., piezoelectric transducer elements and corresponding control electronics. Although, it is not included in this described embodiment, one or more of the interferometry systems described above can also be used to precisely measure the position of the mask stage as well as other moveable elements whose position must be accurately monitored in processes for fabricating lithographic structures (see supra Sheats and Smith *Microlithography: Science and Technology*).

Suspended below exposure base 1104 is a support base 1113 that carries wafer stage 1122. Stage 1122 includes a plane mirror 1128 for reflecting a measurement beam 1154 directed to the stage by interferometry system 1126. A positioning system for positioning stage 1122 relative to interferometry system 1126 is indicated schematically by element 1119. Positioning system 1119 can include, e.g., piezoelectric transducer elements and corresponding control electronics. The measurement beam reflects back to the interferometry system, which is mounted on exposure base 1104. The interferometry system can be any of the embodiments described previously.

During operation, a radiation beam 1110, e.g., an ultraviolet (UV) beam from a UV laser (not shown), passes through a beam shaping optics assembly 1112 and travels downward after reflecting from mirror 1114. Thereafter, the radiation beam passes through a mask (not shown) carried by mask stage 1116. The mask (not shown) is imaged onto a wafer (not shown) on wafer stage 1122 via a lens assembly 1108 carried in a lens housing 1106. Base 1104 and the various components supported by it are isolated from environmental vibrations by a damping system depicted by spring 1120.

In other embodiments of the lithographic scanner, one or more of the interferometry systems described previously can be used to measure distance along multiple axes and angles associated for example with, but not limited to, the wafer and reticle (or mask) stages. Also, rather than a UV laser beam, other beams can be used to expose the wafer including, e.g., x-ray beams, electron beams, ion beams, and visible optical beams.

In some embodiments, the lithographic scanner can include what is known in the art as a column reference. In such embodiments, the interferometry system 1126 directs the reference beam (not shown) along an external reference path that contacts a reference mirror (not shown) mounted on some structure that directs the radiation beam, e.g., lens housing 1106. The reference mirror reflects the reference beam back to the interferometry system. The interference signal produce by interferometry system 1126 when combining measurement beam 1154 reflected from stage 1122 and the reference beam reflected from a reference mirror mounted on the lens housing 1106 indicates changes in the position of the stage relative to the radiation beam. Furthermore, in other embodiments the interferometry system 1126 can be positioned to measure changes in the position of reticle (or mask) stage 1116 or other movable components of the scanner system. Finally, the interferometry systems can be used in a similar fashion with lithography systems involving steppers, in addition to, or rather than, scanners.

Figure 5A:
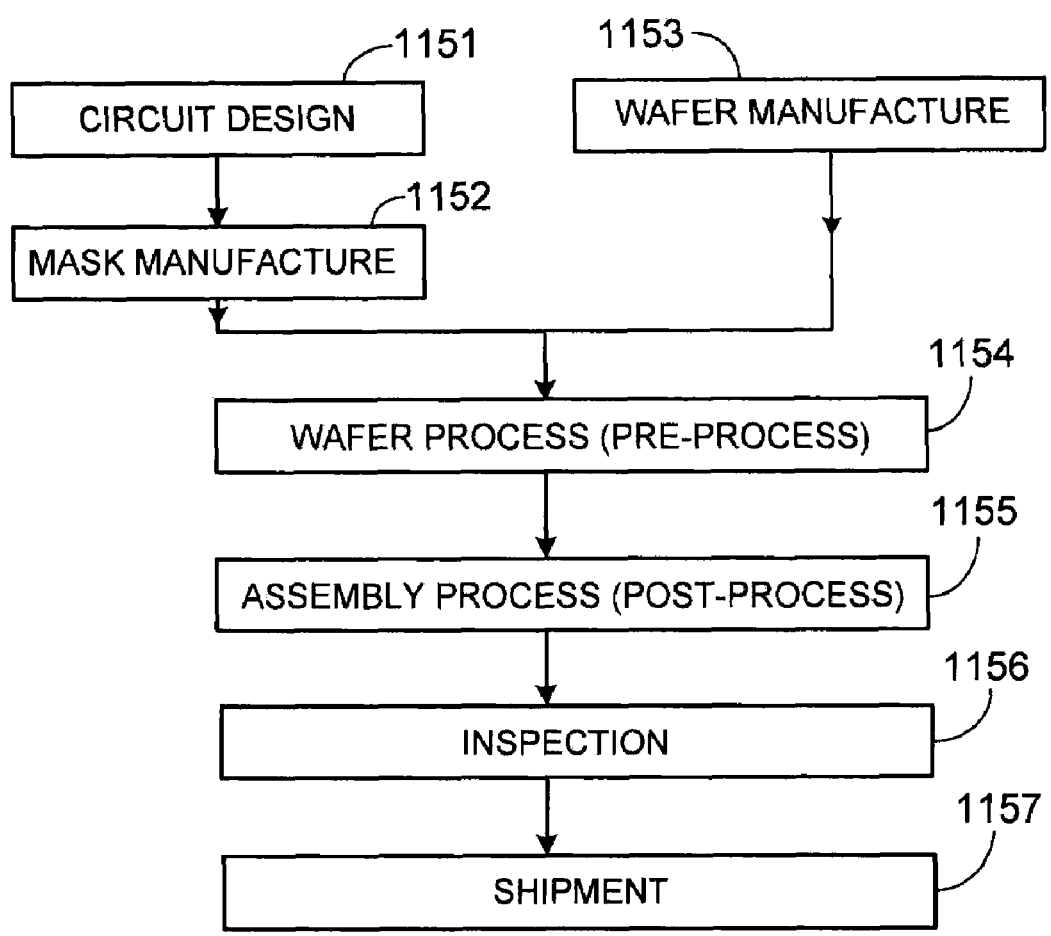
FIG. 5a and FIG. 5b are flow charts that describe steps for making integrated circuits.

As is well known in the art, lithography is a critical part of manufacturing methods for making semiconducting devices. For example, U.S. Pat. No. 5,483,343 outlines steps for such manufacturing methods. These steps are described below with reference to FIGS. 5a and 5b. FIG. 5a is a flow chart of the sequence of manufacturing a semiconductor device such as a semiconductor chip (e.g., IC or LSI), a liquid crystal panel or a CCD. Step 1151 is a design process for designing the circuit of a semiconductor device. Step 1152 is a process for manufacturing a mask on the basis of the circuit pattern design. Step 1153 is a process for manufacturing a wafer by using a material such as silicon.

Step 1154 is a wafer process which is called a pre-process wherein, by using the so prepared mask and wafer, circuits are formed on the wafer through lithography. To form circuits on the wafer that correspond with sufficient spatial resolution those patterns on the mask, interferometric positioning of the lithography tool relative the wafer is necessary. The interferometry methods and systems described herein can be especially useful to improve the effectiveness of the lithography used in the wafer process.

Step 1155 is an assembling step, which is called a post-process wherein the wafer processed by step 1154 is formed into semiconductor chips. This step includes assembling (dicing and bonding) and packaging (chip sealing). Step 1156 is an inspection step wherein operability check, durability check and so on of the semiconductor devices produced by step 1155 are carried out. With these processes, semiconductor devices are finished and they are shipped (step 1157).

Figure 5B:
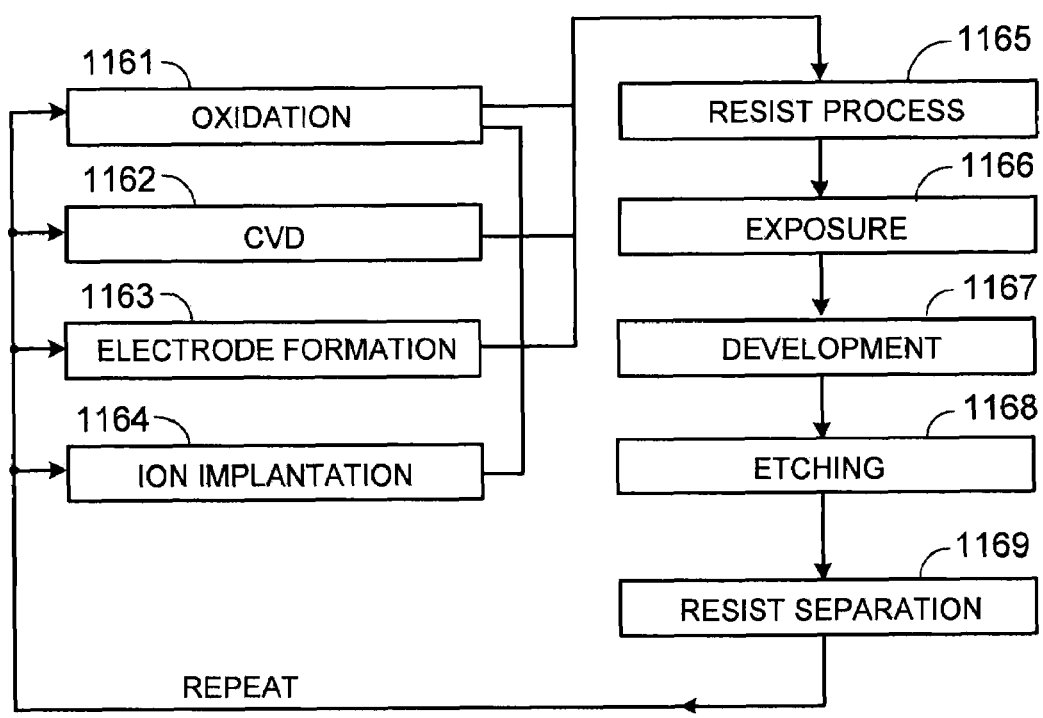

FIG. 5b is a flow chart showing details of the wafer process. Step 1161 is an oxidation process for oxidizing the surface of a wafer. Step 1162 is a CVD process for forming an insulating film on the wafer surface. Step 1163 is an electrode forming process for forming electrodes on the wafer by vapor deposition. Step 1164 is an ion implanting process for implanting ions to the wafer. Step 1165 is a resist process for applying a resist (photosensitive material) to the wafer. Step 1166 is an exposure process for printing, by exposure (i.e., lithography), the circuit pattern of the mask on the wafer through the exposure apparatus described above. Once again, as described above, the use of the interferometry systems and methods described herein improve the accuracy and resolution of such lithography steps.

Step 1167 is a developing process for developing the exposed wafer. Step 1168 is an etching process for removing portions other than the developed resist image. Step 1169 is a resist separation process for separating the resist material remaining on the wafer after being subjected to the etching process. By repeating these processes, circuit patterns are formed and superimposed on the wafer.

The interferometry systems described above can also be used in other applications in which the relative position of an object needs to be measured precisely. For example, in applications in which a write beam such as a laser, x-ray, ion, or electron beam, marks a pattern onto a substrate as either the substrate or beam moves, the interferometry systems can be used to measure the relative movement between the substrate and write beam.

Figure 6:
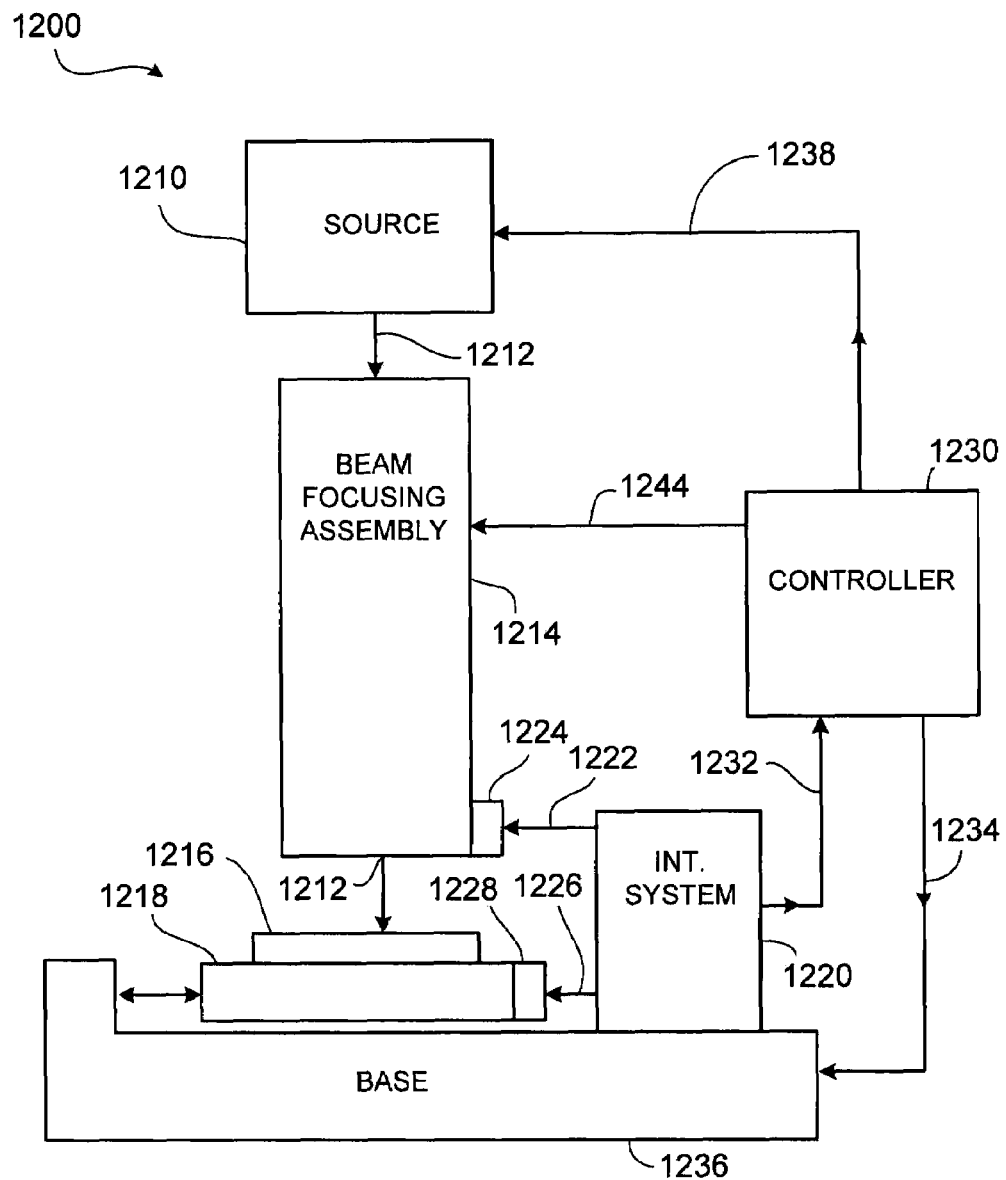
FIG. 6 is a schematic of a beam writing system that includes an interferometry system.

As an example, a schematic of a beam writing system 1200 is shown in FIG. 6. A source 1210 generates a write beam 1212, and a beam focusing assembly 1214 directs the radiation beam to a substrate 1216 supported by a movable stage 1218. To determine the relative position of the stage, an interferometry system 1220 directs a reference beam 1222 to a mirror 1224 mounted on beam focusing assembly 1214 and a measurement beam 1226 to a mirror 1228 mounted on stage 1218. Since the reference beam contacts a mirror mounted on the beam focusing assembly, the beam writing system is an example of a system that uses a column reference. Interferometry system 1220 can be any of the interferometry systems described previously. Changes in the position measured by the interferometry system correspond to changes in the relative position of write beam 1212 on substrate 1216. Interferometry system 1220 sends a measurement signal 1232 to controller 1230 that is indicative of the relative position of write beam 1212 on substrate 1216. Controller 1230 sends an output signal 1234 to a base 1236 that supports and positions stage 1218. In addition, controller 1230 sends a signal 1238 to source 1210 to vary the intensity of, or block, write beam 1212 so that the write beam contacts the substrate with an intensity sufficient to cause photophysical or photochemical change only at selected positions of the substrate.

Furthermore, in some embodiments, controller 1230 can cause beam focusing assembly 1214 to scan the write beam over a region of the substrate, e.g., using signal 1244. As a result, controller 1230 directs the other components of the system to pattern the substrate. The patterning is typically based on an electronic design pattern stored in the controller. In some applications the write beam patterns a resist coated on the substrate and in other applications the write beam directly patterns, e.g., etches, the substrate.

An important application of such a system is the fabrication of masks and reticles used in the lithography methods described previously. For example, to fabricate a lithography mask an electron beam can be used to pattern a chromium-coated glass substrate. In such cases where the write beam is an electron beam, the beam writing system encloses the electron beam path in a vacuum. Also, in cases where the write beam is, e.g., an electron or ion beam, the beam focusing assembly includes electric field generators such as quadrapole lenses for focusing and directing the charged particles onto the substrate under vacuum. In other cases where the write beam is a radiation beam, e.g., x-ray, UV, or visible radiation, the beam focusing assembly includes corresponding optics and for focusing and directing the radiation to the substrate.

A number of embodiments of the invention have been described. Nevertheless, it will be understood that various modifications may be made without departing from the spirit and scope of the invention. Accordingly, other embodiments are within the scope of the following claims.

What is claimed is:

1. A method, comprising:
  using an interferometry assembly to provide three different output beams, each output beam comprising an interferometric phase related to an optical path difference between a corresponding first beam and a corresponding second beam, each first beam contacting a measurement object at least once and each first beam having the same wavelength;
  monitoring the interferometric phases for each of the three different output beams; and
  deriving information about variations in the optical properties of a gas in the first beam paths from the three monitored phases,
  wherein deriving the information comprises determining values of a second difference parameter, SDP, from the monitored interferometric phases and determining a difference, $SDP_T$, between the second difference parameter value at time, t, and an average second difference parameter value.

2. The method of claim 1 wherein the interferometer assembly defines three interferometer axes and each interferometric phase includes information about a position of the measurement object along a corresponding one of the interferometer axes.

3. The method of claim 2 wherein the interferometer axes are parallel.

4. The method of claim 2 wherein the interferometer axes are coplanar.

5. The method of claim 1 wherein each of the first beams make more than one pass to the measurement object and contact the measurement object more than once.

6. The method of claim 5 wherein each of the first beams contact the measurement object at a common location for at least one of the passes to the measurement object.

7. The method of claim 1 wherein each of the second beams also contact the measurement object.

8. The method of claim 7 wherein each of the second beams contact the measurement object at a location different than that of the corresponding first beams.

9. The method of claim 1 wherein the variations in the optical properties of the gas are caused by local refractivity variations that move through the first beam paths.

10. The method of claim 9 wherein variations in the three interferometric phases are temporally correlated to the local refractivity variations.

11. The method of claim 1 further comprising monitoring a degree of freedom of the measurement object from one of the interferometric phases.

12. The method of claim 11 wherein deriving the information comprises reducing errors in the monitored degree of freedom, where the errors are related to the variations in the optical properties of a gas in the first beam paths.

13. The method of claim 12 wherein the errors are reduced while the phases are being monitored.

14. The method of claim 11 wherein the degree of freedom is a displacement of the measurement object along an interferometer axis defined by the interferometry assembly.

15. The method of claim 11 wherein the degree of freedom is an orientation of the measurement object with respect to an interferometer axis defined by the interferometry assembly.

16. The method of claim 1 wherein deriving the information comprises determining values of a parameter from the monitored interferometric phases where, for a given position of the measurement object, the parameter is based on a difference between the position of the measurement object along a first interferometer axis and the position of the measurement object along a second interferometer axis parallel to the first interferometer axis, the first and second interferometer axes being defined by the interferometry assembly.

17. The method of claim 16 wherein the parameter is also based on a difference between the position of the measurement object along the second interferometer axis and the position of the measurement object along a third interferometer axis parallel to the second interferometer axis, the third interferometry axis being defined by the interferometry assembly.

18. The method of claim 1 wherein a time average of the contributions of the variations of the optical properties of the gas to the second difference parameter is zero.

19. The method of claim 1 wherein deriving the information further comprises integrating the difference $SDP_T$ over a time period.

20. The method of claim 19 wherein the integration involves a product of the difference $SDP_T$ and a velocity of the variations in the optical properties of a gas through the first beam paths.

21. The method of claim 20 wherein the integration provides information about a contribution, $\zeta$, to one of the monitored interferometric phases of the variations in the optical properties of the gas or a spatial derivative of $\zeta$.

22. The method of claim 1 wherein the variations of the optical properties of the gas are related to a local variation in the refractivity of the gas that moves non-parallel to the first beam paths as the local variation in the refractivity of the gas moves through the first beam paths.

23. The method of claim 1 further comprising using a lithography tool to expose a substrate supported by a moveable stage with radiation while interferometrically monitoring the position or orientation of the stage based on the derived information.

24. A system, comprising:
an interferometry assembly configured to provide three different output beams, each output beam comprising an interferometric phase related to an optical path difference between a corresponding first beam and a corresponding second beam, where the interferometry assembly directs each first beam to contact a measurement object at least once and each first beam has the same wavelength;
three detectors each positioned in a path of a corresponding output beam; and
an electronic processor coupled to the detectors, the electronic processor being configured to monitor the three interferometric phases and to derive information about variations in the optical properties of a gas in the measurement beam paths from the three monitored phases,
wherein the electronic processor is configured to derive the information by determining values of a second difference parameter, SDP, from the monitored interferometric phases and determining a difference, $SDP_T$, between the second difference parameter value at time, t, and an average second difference parameter value.

25. The system of claim 24 wherein the interferometry assembly is configured to direct each of the first beams to contact the measurement object more than once.

26. The system of claim 25 wherein the interferometry assembly is configured to direct each of the first beams to contact the first beams to contact the measurement object at a common location for at least one of the passes to the measurement object.

27. The system of claim 24 wherein the interferometry assembly is configured to direct each of the second beams to contact the measurement object.

28. The system of claim 24 wherein the measurement object is a plane mirror measurement object.

29. The system of claim 24 wherein the interferometry assembly defines three different interferometer axes where the interferometric phase of each output beam corresponds to a position of the measurement object with respect to a corresponding one of the measurement axes.

30. The system of claim 29 wherein the interferometer axes are parallel.

31. The system of claim 29 wherein the interferometer axes are coplanar.

32. The system of claim 24 further comprising a stage that is moveable with respect to the interferometry assembly, where the measurement object is attached to the stage.

33. A lithography system for use in fabricating integrated circuits on a wafer, the system comprising:
the system of claim 24;
an illumination system for imaging spatially patterned radiation onto a wafer supported by the moveable stage; and
a positioning system for adjusting the position of the stage relative to the imaged radiation;
wherein the interferometer assembly is configured to monitor the position of the wafer relative to the imaged radiation and electronic processor is configured to use the information about to the variations in the optical properties of the gas to improve the accuracy of the monitored position of the wafer.

34. A beam writing system for use in fabricating a lithography mask, the system comprising:
the system of claim 24;
a source providing a write beam to pattern a substrate supported by the moveable stage;
a beam directing assembly for delivering the write beam to the substrate;
a positioning system for positioning the stage and beam directing assembly relative one another;
wherein the interferometer assembly is configured to monitor the position of the stage relative to the beam directing assembly and electronic processor is configured to use the information about to the variations in the optical properties of the gas to improve the accuracy of the monitored position of the stage.

35. A method, comprising:
using an interferometry assembly to provide three different output beams, each output beam comprising an interferometric phase related to an optical path difference between a corresponding first beam and a corresponding second beam, each first beam contacting a measurement object at least once;
monitoring the interferometric phases for each of the three different output beams; and
deriving information about variations in the optical properties of a gas in the first beam paths from the three monitored phases
wherein deriving the information comprises determining values of a second difference parameter, SDP, from the monitored interferometric phases and determining a difference, $SDP_T$, between the second difference parameter value at time, t, and an average second difference parameter value.

36. The method of claim 35 wherein deriving the information further comprises integrating the difference $SDP_T$ over a time period.

37. The method of claim 36 wherein the integration involves a product of the difference $SDP_T$ and a velocity of the variations in the optical properties of a gas through the first beam paths.

38. The method of claim 37 wherein the integration provides information about a contribution, $\zeta$, to one of the monitored interferometric phases of the variations in the optical properties of the gas or a spatial derivative of $\zeta$.

* * * * *

UNITED STATES PATENT AND TRADEMARK OFFICE
CERTIFICATE OF CORRECTION

PATENT NO.        : 7,528,961 B2                                          Page 1 of 1
APPLICATION NO.   : 11/413917
DATED             : May 5, 2009
INVENTOR(S)       : Henry A. Hill It is certified that error appears in the above-identified patent and that said Letters Patent is hereby corrected as shown below:

In Claim 1 column 28, line 2, delete "$SDP_T$," and insert --$SDP_T$,--.

Signed and Sealed this

Twenty-third Day of June, 2009

JOHN DOLL
*Acting Director of the United States Patent and Trademark Office*